(12) United States Patent
Fu

(10) Patent No.: US 11,361,713 B1
(45) Date of Patent: Jun. 14, 2022

(54) DISPLAY PANEL AND DISPLAY DEVICE

(71) Applicant: Shanghai Tianma Micro-Electronics Co., Ltd., Shanghai (CN)

(72) Inventor: Jujian Fu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 17/387,777

(22) Filed: Jul. 28, 2021

(30) Foreign Application Priority Data

May 17, 2021 (CN) .......................... 202110536288.4

(51) Int. Cl.
*G09G 3/3233* (2016.01)
*H01L 27/32* (2006.01)

(52) U.S. Cl.
CPC ....... *G09G 3/3233* (2013.01); *H01L 27/3265* (2013.01); *G09G 2300/0426* (2013.01); *G09G 2300/0842* (2013.01); *G09G 2310/0286* (2013.01); *G09G 2310/0297* (2013.01); *G09G 2310/061* (2013.01)

(58) Field of Classification Search
CPC ......... G09G 3/3233; G09G 2300/0426; G09G 2300/0842; G09G 2310/0286; G09G 2310/0297; G09G 2310/061; H01L 27/3265
See application file for complete search history.

(56) References Cited

FOREIGN PATENT DOCUMENTS

| CN | 111508435 A | 8/2020 | |
|---|---|---|---|
| CN | 112164371 A | * 1/2021 | ........... G09G 3/3208 |

* cited by examiner

*Primary Examiner* — Stacy Khoo
(74) *Attorney, Agent, or Firm* — Anova Law Group, PLLC

(57) ABSTRACT

A display panel and a display device are provided. The display panel includes a pixel circuit including a driving module, a first reset module, a compensation module, a light-emitting control module and a light-emitting module. The first reset module includes a first dual-gate transistor, and the compensation module includes a second dual-gate transistor. A first intermediate node of the first dual-gate transistor and a second intermediate node of the second dual-gate transistor are electrically connected to a light-emitting control signal line through a first capacitor and a second capacitor, respectively. The first dual-gate transistor includes a first parasitic capacitor corresponding to the first capacitor, and the second dual-gate transistor includes a second parasitic capacitor corresponding to the second capacitor. A capacitance of at least one of the first capacitor and the second capacitor is greater than or equal to a capacitance of the corresponding parasitic capacitor.

20 Claims, 13 Drawing Sheets

100   1000

DISPLAY PANEL AND DISPLAY DEVICE

CROSS-REFERENCE TO RELATED APPLICATION

This application claims the priority of Chinese patent application No. 202110536288.4, filed on May 17, 2021, the entirety of which is incorporated herein by reference.

FIELD

The present disclosure generally relates to the field of display technology and, more particularly, relates to a display panel and a display device.

BACKGROUND

With the development of display technology, variable frequency drive technology has gradually been applied to display panels. For example, a driving mode with a substantially high refresh rate is used to display dynamic images (e.g., a scene of a sport event or a game), to ensure the smoothness of the display images. A driving mode with a substantially low refresh rate is used to display slow motion images or a static image, to reduce power consumption. In the low frequency mode, a flicker phenomenon tends to occur.

SUMMARY

One aspect of the present disclosure provides a display panel. The display panel includes a pixel circuit including a driving module, a first reset module, a compensation module, a light-emitting control module and a light-emitting module. The driving module, the light-emitting control module and the light-emitting module are connected in series between a first power line and a second power line. The driving module is configured to drive the light-emitting module to emit light. The light-emitting control module is configured to control the light-emitting module to enter a light-emitting stage, and a control terminal of the light-emitting control module is electrically connected to a light-emitting control signal line. The first reset module is connected in series between a reference signal line and a control terminal of the driving module. The first reset module includes a first dual-gate transistor. A gate of the first dual-gate transistor is electrically connected to a first scanning signal line, and a first intermediate node of the first dual-gate transistor is electrically connected to the light-emitting control signal line through a first capacitor. The compensation module is connected in series between the control terminal of the driving module and a second terminal of the driving module. The compensation module includes a second dual-gate transistor. A gate of the second dual-gate transistor is electrically connected to a second scanning signal line, and a second intermediate node of the second dual-gate transistor is electrically connected to the light-emitting control signal line through a second capacitor. The first dual-gate transistor includes a first parasitic capacitor, and the second dual-gate transistor includes a second parasitic capacitor. The first capacitor corresponds to the first parasitic capacitor, and the second capacitor corresponds to the second parasitic capacitor. A capacitance of the first capacitor is greater than or equal to a capacitance of the first parasitic capacitor, and/or a capacitance of the second capacitor is greater than or equal to a capacitance of the second parasitic capacitor.

Another aspect of the present disclosure provides a display device. The display device includes a display panel. The display panel includes a pixel circuit including a driving module, a first reset module, a compensation module, a light-emitting control module and a light-emitting module. The driving module, the light-emitting control module and the light-emitting module are connected in series between a first power line and a second power line. The driving module is configured to drive the light-emitting module to emit light. The light-emitting control module is configured to control the light-emitting module to enter a light-emitting stage, and a control terminal of the light-emitting control module is electrically connected to a light-emitting control signal line. The first reset module is connected in series between a reference signal line and a control terminal of the driving module. The first reset module includes a first dual-gate transistor. A gate of the first dual-gate transistor is electrically connected to a first scanning signal line, and a first intermediate node of the first dual-gate transistor is electrically connected to the light-emitting control signal line through a first capacitor. The compensation module is connected in series between the control terminal of the driving module and a second terminal of the driving module. The compensation module includes a second dual-gate transistor. A gate of the second dual-gate transistor is electrically connected to a second scanning signal line, and a second intermediate node of the second dual-gate transistor is electrically connected to the light-emitting control signal line through a second capacitor. The first dual-gate transistor includes a first parasitic capacitor, and the second dual-gate transistor includes a second parasitic capacitor. The first capacitor corresponds to the first parasitic capacitor, and the second capacitor corresponds to the second parasitic capacitor. A capacitance of the first capacitor is greater than or equal to a capacitance of the first parasitic capacitor, and/or a capacitance of the second capacitor is greater than or equal to a capacitance of the second parasitic capacitor.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

It should be noted that the relational terms such as "first" and "second" are merely used to distinguish one entity or operation from another entity or operation, and do not necessarily require or imply any such actual relationship or sequence between these entities or operations.

It should be understood that when describing the structure of a component, when a layer or a region is referred to as being "on" or "above" another layer or another region, the layer or the region may be directly on the other layer or the other region, or other layers or regions may be contained between the layer or the region and the another layer or the another region. Further, when a component is turned over, the layer or the region may be "under" or "below" the another layer or the another region.

The present disclosure provides a display panel. In one embodiment, the display panel in the present disclosure may support a low frequency mode and a high frequency mode. For example, the low frequency mode may include a refresh rate less than 60 Hz, such as 30 Hz, 15 Hz, etc. The high frequency mode may include a refresh rate greater than or equal to 60 Hz, such as 60 Hz, 90 Hz, 120 Hz, 144 Hz, etc.

Figure 1:
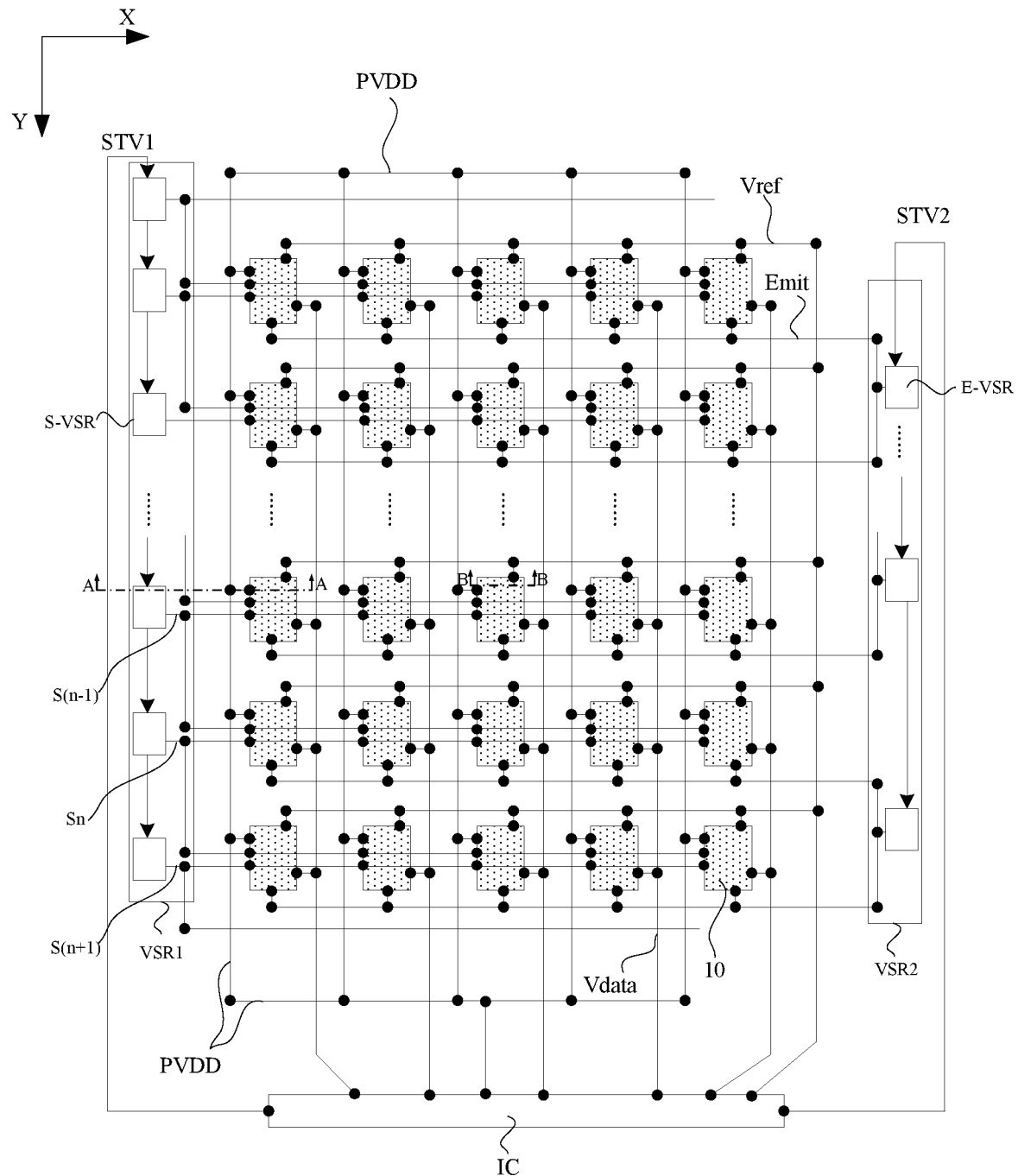
FIG. 1 illustrates a schematic top view of an exemplary display panel consistent with disclosed embodiments of the present disclosure.

Referring to FIG. 1, the display panel 100 may include a plurality of pixel circuits 10. The plurality of pixel circuits 10 may be arranged in an array. For example, the plurality of pixel circuits 10 may be arranged in an array in a first direction X and a second direction Y that intersect each other. In one embodiment, the first direction X may be a row direction, and the second direction Y may be a column direction. In another embodiment, the first direction X may be a column direction, and the second direction Y may be a row direction.

In one embodiment, the display panel 100 may further include a driving chip IC, a first shift register VSR1, a second shift register VSR2, a first power line PVDD, a data signal line Vdata, a reference signal line Vref, scanning signal lines S(n−1), Sn, S(n+1), and a light-emitting control signal line Emit.

The first shift register VSR1 may include a plurality of cascaded first shift register circuits S-VSR1, and each first shift register circuit S-VSR1 may be connected to the pixel circuit 10 through a scanning signal line. The first shift register VSR1 may be configured to provide a scanning signal to the pixel circuit 10. The driving chip IC may provide a first start signal STV1 to the first shift register VSR1. In addition, as shown in FIG. 1, except for the first-level and last-level first shift register circuits S-VSR1, each of the remaining first shift register circuits S-VSR1 of the plurality of cascaded first shift register circuits S-VSR1 may provide a scanning signal to adjacent two rows of pixel circuits 10. In view of this, two rows of dummy pixel circuits (not shown in FIG. 1) may be disposed on the display panel, which may be connected to the scanning line corresponding to the first-level first shift register circuit S-VSR1 and the scanning line corresponding to the last-level first shift register circuit S-VSR1, respectively. The dummy pixel circuit may not be used for display.

The second shift register VSR2 may include a plurality of cascaded second shift register circuits E-VSR, and each second shift register circuit E-VSR may be connected to adjacent two rows of pixel circuits 10 through the light-emitting control signal line Emit. The second shift register VSR2 may be configured to provide a light-emitting control signal to the adjacent two rows of pixel circuits 10. The driving chip IC may provide a second start signal STV2 to the second shift register VSR2.

In addition, a clock signal line (not shown in the Figure), a high-level signal line (VGH, not shown in the Figure), and a low-level signal line (VGL, not shown in the Figure) may be connected between the first shift register VSR1 and the driving chip IC and between the second shift register VSR2 and the driving chip IC. The driving chip IC may provide clock signals, high-level signals and low-level signals to the first shift register VSR1 and the second shift register VSR2.

For example, referring to FIG. 1, the display panel 100 may include one first shift register VSR1 and one second shift register VSR2. In one embodiment, the one first shift register VSR1 and the one second shift register VSR2 may be disposed on opposite sides of the display panel 100 in the second direction Y. In another embodiment, the one first shift register VSR1 and the one second shift register VSR2 may be disposed on a same side of the display panel 100.

For another example, the display panel 100 may include two first shift registers VSR1 and two second shift registers VSR2. Each end of the scanning signal line may be electrically connected to a first shift register VSR1 of the two first shift registers VSR1, and each end of the light-emitting control signal line Emit may be electrically connected to a second shift register VSR2 of the two second shift registers VSR2.

For another example, the display panel 100 may include two first shift registers VSR1. One of the two first shift registers VSR1 may be electrically connected to an odd row of pixel circuits through a scanning signal line, and the other one of the two first shift registers VSR1 may be electrically connected to an even row of pixel circuits through a scanning signal line.

For another example, the display panel 100 may include two second shift registers VSR2. One of the two second shift registers VSR2 may be electrically connected to an odd row of pixel circuits through a light-emitting control signal line, and the other one of the two second shift registers VSR2 may be electrically connected to an even row of pixel circuits through a light-emitting control signal line.

The first shift register VSR1 and the second shift register VSR2 in the foregoing embodiments may merely be certain examples, which may not be limited by the present disclosure. In one embodiment, a shift register that is capable of simultaneously generating a scanning signal and a light-emitting control signal may be provided, which may not be limited by the present disclosure.

Figure 2:
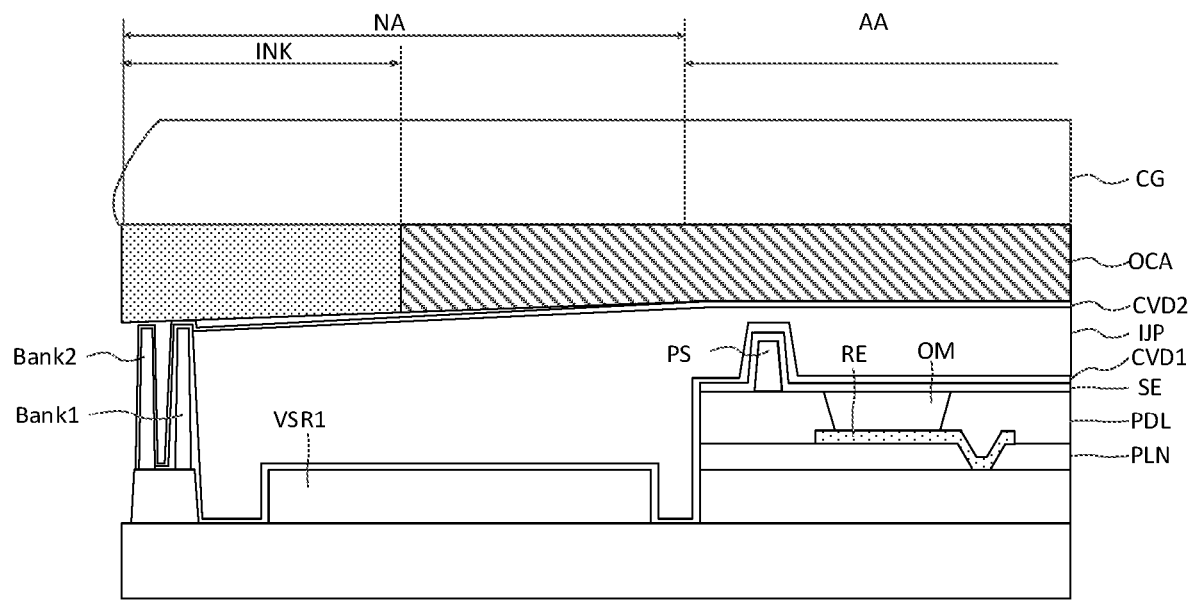
FIG. 2 illustrates a schematic AA-sectional view of an exemplary display panel in FIG. 1 consistent with disclosed embodiments of the present disclosure.

In one embodiment, referring to FIG. 2, the display panel may include a display region AA and a non-display region NA, and the non-display region NA may include an ink region INK. In one embodiment, the display panel may include a substrate 01 and a driving circuit layer 02 disposed on a side of the substrate 01. FIG. 2 may also illustrate a planarization layer PLN, a pixel definition layer PDL, a light-emitting element (the light-emitting element may include an anode RE, an organic light-emitting layer OM and a cathode SE), a supporting pillar PS, a thin film encapsulation layer (including a first inorganic layer CVD1, an organic Layer IJP and a second inorganic layer CVD2), an optical adhesive layer OCA, and a cover plate CG. In addition, FIG. 2 may illustrate the first shift register VSR1, a first retaining wall Bank1, and a second retaining wall Bank2. The first shift register VSR1 may be disposed in the non-display region NA of the driving circuit layer 02.

Figure 3:
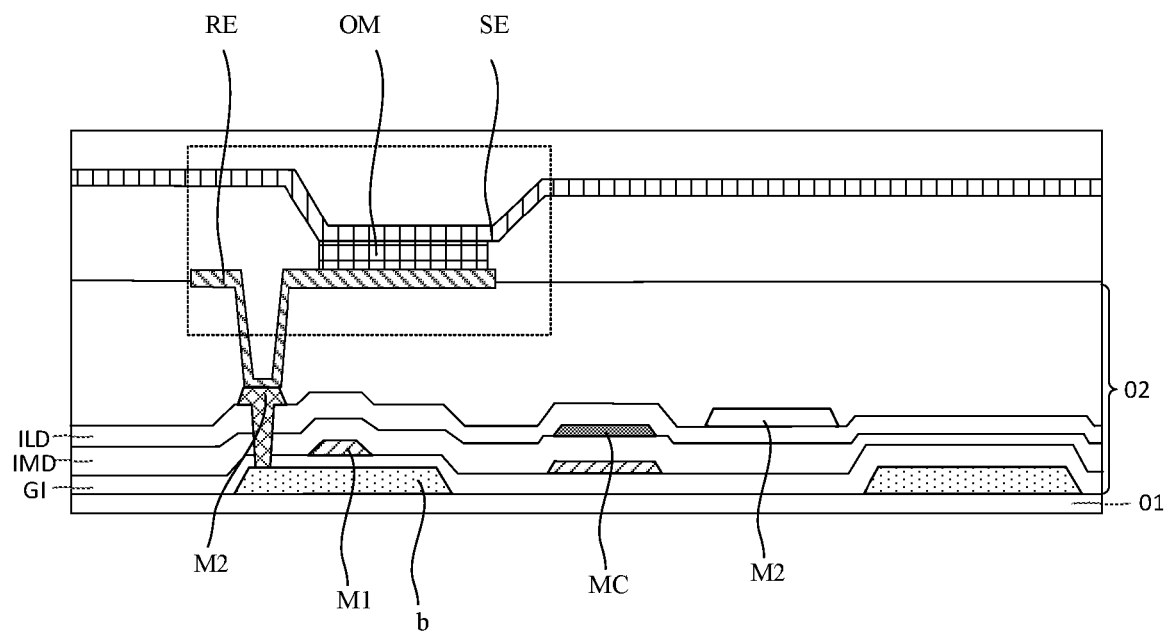
FIG. 3 illustrates a schematic BB-sectional view of an exemplary display panel in FIG. 1 consistent with disclosed embodiments of the present disclosure.

The pixel circuit 10 may be disposed in the driving circuit layer 02, and the pixel circuit 10 may be connected to the anode RE of the light-emitting element. Referring to FIG. 3, the driving circuit layer 02 of the display panel may include a gate metal layer M1, a capacitor metal layer MC, and a source-drain metal layer M2 that are sequentially stacked in a direction away from the substrate 01. A semiconductor layer b may be disposed between the gate metal layer M1 and the substrate 01. An insulating layer may be disposed between adjacent metal layers and between the semiconductor layer b and the gate metal layer M1. In one embodiment, a gate insulating layer GI may be disposed between the gate metal layer M1 and the semiconductor layer b. A capacitor insulating layer IMD may be disposed between the capacitor metal layer MC and the gate metal layer M1. An interlayer dielectric layer ILD may be disposed between the source-drain metal layer M2 and the capacitor metal layer MC.

The semiconductor layer b may be a semiconductor layer where an active layer of a transistor is located. The gate metal layer M1 may be a conductive metal layer where a gate of the transistor is located. The capacitor metal layer MC may be a conductive metal layer where one of plates of a capacitor is located. The source-drain metal layer M2 may be a conductive metal layer where source and drain of the transistor are located.

In one embodiment, the scanning signal lines S(n−1), Sn, S(n+1) and the light-emitting control signal line Emit may be disposed in the gate metal layer M1. The reference signal line Vref may be disposed in the capacitor metal layer MC.

The first power line PVDD and the data signal line Vdata may be disposed in the source-drain metal layer M2.

Figure 4:
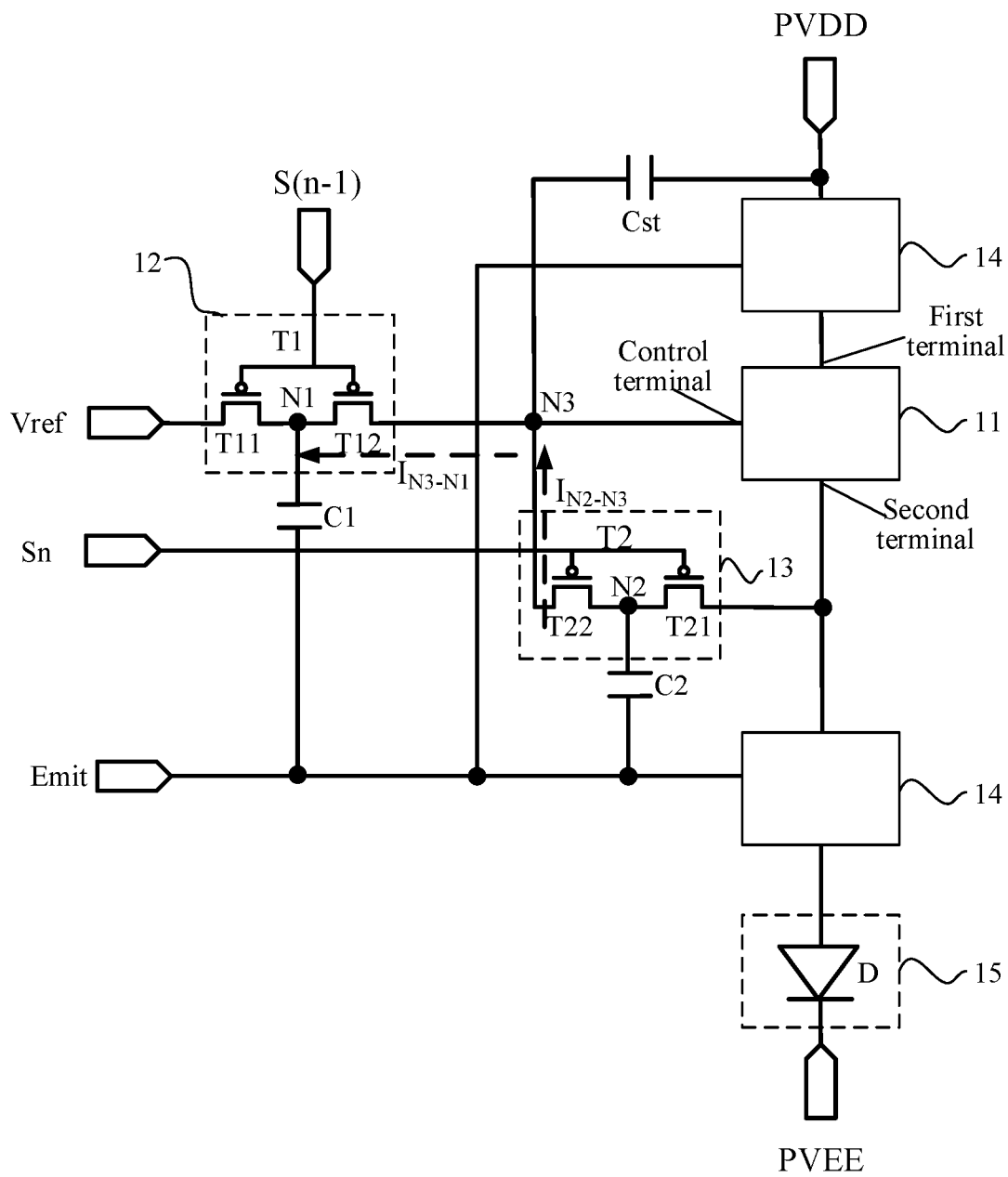
FIG. 4 illustrates a schematic circuit diagram of an exemplary pixel circuit consistent with disclosed embodiments of the present disclosure.

Referring to FIG. 4, the pixel circuit 10 may include a driving module 11, a first reset module 12, a compensation module 13, a light-emitting control module 14 and a light-emitting module 15.

The driving module 11, the light-emitting control module 14 and the light-emitting module 15 may be connected in series between the first power line PVDD and a second power line PVEE. The driving module 11 may be configured to drive the light-emitting module 15 to emit light. The light-emitting control module 14 may be configured to control the light-emitting module 15 to enter a light-emitting stage. A control terminal of the light-emitting control module 15 may be electrically connected to the light-emitting control signal line Emit. The first reset module 12 may be connected in series between the reference signal line Vref and the control terminal of the driving module 11. The first reset module 12 may include a first dual-gate transistor T1. A gate of the first dual-gate transistor T1 may be electrically connected to the first scanning signal line S(n−1), and a first intermediate node N1 of the first dual-gate transistor T1 may be electrically connected to the light-emitting control signal line Emit through a first capacitor C1.

The compensation module 13 may be connected in series between the control terminal of the driving module 11 and the second terminal of the driving module 11. The compensation module 13 may include a second dual-gate transistor T2. A gate of the second dual-gate transistor T2 may be electrically connected to the second scanning signal line Sn, and a second intermediate node N2 of the second dual-gate transistor T2 may be electrically connected to the light-emitting control signal line Emit through a second capacitor C2. The first dual-gate transistor T1 may include a first parasitic capacitor, and the second dual-gate transistor T2 may include a second parasitic capacitor. The first capacitor C1 may correspond to the first parasitic capacitor, and the second capacitor C2 may correspond to the second parasitic capacitor. A capacitance of at least one of the first capacitor C1 and the second capacitor C2 may be greater than or equal to a capacitance of the corresponding parasitic capacitor.

Each of the first dual-gate transistor T1 and the second dual-gate transistor T2 may be a dual-gate transistor. It should be understood that each of the first dual-gate transistor T1 and the second dual-gate transistor T2 may include two sub-transistors. For illustrative purposes, the first dual-gate transistor T1 may include a first sub-transistor T11 and a second sub-transistor T12, and the second dual-gate transistor T2 may include a third sub-transistor T21 and a fourth sub-transistor T22 as an example. The first intermediate node N1 may be a connection point between a second electrode of the first sub-transistor T11 and a first electrode of the second sub-transistor T12, and the second intermediate node N2 may be a connection point between a second electrode of the third sub-transistor T21 and a first electrode of the fourth sub-transistor T22. A first electrode of the first sub-transistor T11 may be electrically connected to the reference signal line Vref, and a second electrode of the second sub-transistor T12 may be electrically connected to a control terminal of the driving module 11. A first electrode of the third sub-transistor T21 may be electrically connected to a second terminal of the driving module 11, and a second electrode of the fourth sub-transistor T22 may be electrically connected to the control terminal of the driving module 11.

The first parasitic capacitor may be formed between the second electrode of the first sub-transistor T11 and the first electrode of the second sub-transistor T12 and between the first intermediate node N1 and two gates of the first dual-gate transistor T1. The second parasitic capacitor may be formed between the second electrode of the third sub-transistor T21 and the first electrode of the fourth sub-transistor T22 and between the second intermediate node N2 and two gates of the second dual-gate transistor T2.

In one embodiment, the light-emitting module 15 may include at least one light-emitting element D, and the light-emitting element may be an organic light-emitting diode (OLED).

Referring to FIG. 4, the first scanning signal line S(n−1) may control the turn-on or turn-off of the first dual-gate transistor T1 of the pixel circuit, and may reset a potential of the control terminal of the driving module 11 when the first dual-gate transistor T1 is turned on. The second scanning signal line Sn may control the turn-on or turn-off of the second dual-gate transistor T2 of the pixel circuit, and may compensate a threshold voltage of the driving module 11 when the second dual-gate transistor T2 is turned on. The light-emitting control signal line Emit may control the turn-on or turn-off of the light-emitting control module 14 of the pixel circuit, and may control the light-emitting module 15 to emit light when the light-emitting control module 14 is turned on.

Each row of pixel circuits 10 used for display may at least be connected with a corresponding first scanning signal line and a corresponding second scanning signal line.

The first power line PVDD may be configured to provide a power supply voltage, and a voltage on the first power line PVDD may be a positive voltage, such as 4.6V. A voltage on the second power line PVEE may be a negative voltage, such as −2.5V. The reference signal line Vref may be configured to provide a reset voltage signal, and a voltage on the reference signal line Vref may be a negative voltage, such as −3.5V.

For illustrative purposes, in the following embodiments, each of the first dual-gate transistor T1 and the second dual-gate transistor T2 in the pixel circuit 10 may be a P-type transistor, and the light-emitting control module 14 may be turned on when the potential on the light-emitting control signal line Emit is at a low-level as an example. The potential for controlling the turn-on of the P-type transistor may be at a low-level, and the potential for controlling the turn-off of the P-type transistor may be at a high-level.

Figure 5:
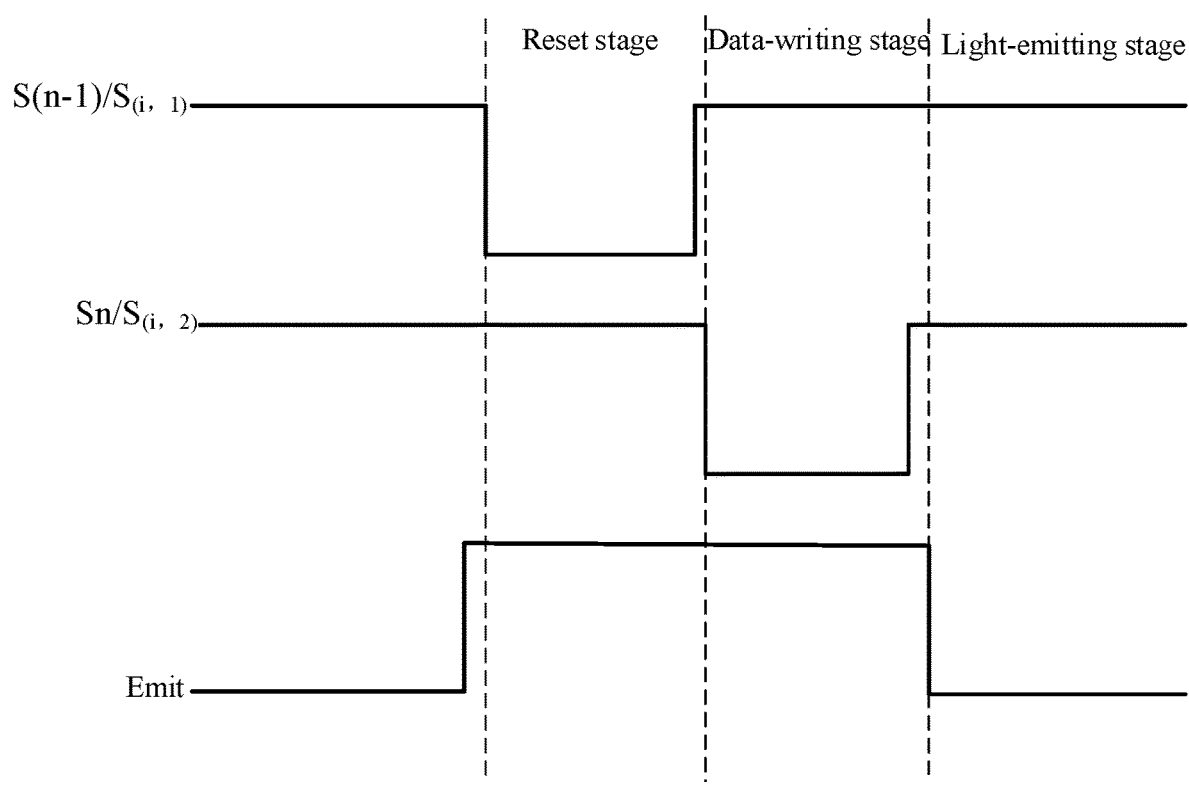
FIG. 5 illustrates an exemplary timing sequence diagram of a display panel in FIG. 4 consistent with disclosed embodiments of the present disclosure.

Referring to FIG. 5, the driving process of the pixel circuit 10 may include a reset stage, a data-writing stage, and a light-emitting stage. In the reset stage, the first scanning signal line S(n−1) may provide a low-level signal, the first dual-gate transistor T1 may be turned on to reset the potential of control terminal of the driving module 11. In the data-writing stage, the second scanning signal line Sn may provide a low-level signal, the second dual-gate transistor T2 may be turned on to compensate the threshold voltage of the driving module 11. In the light-emitting stage, the light-emitting control signal line Emit may provide a low-level signal, the light-emitting control module 14 may be turned on, and the driving current generated by the driving module 11 may be transmitted to the light-emitting module 15 to control the light-emitting module 15 to emit light.

In one embodiment, the control terminal of the driving module 11, the first dual-gate transistor T1 and the second dual-gate transistor T2 may be connected to a third node N3. The potential of the third node N3 in FIG. 7 and FIG. 8 may represent the potential of the control terminal of the driving module 11.

Figure 6:
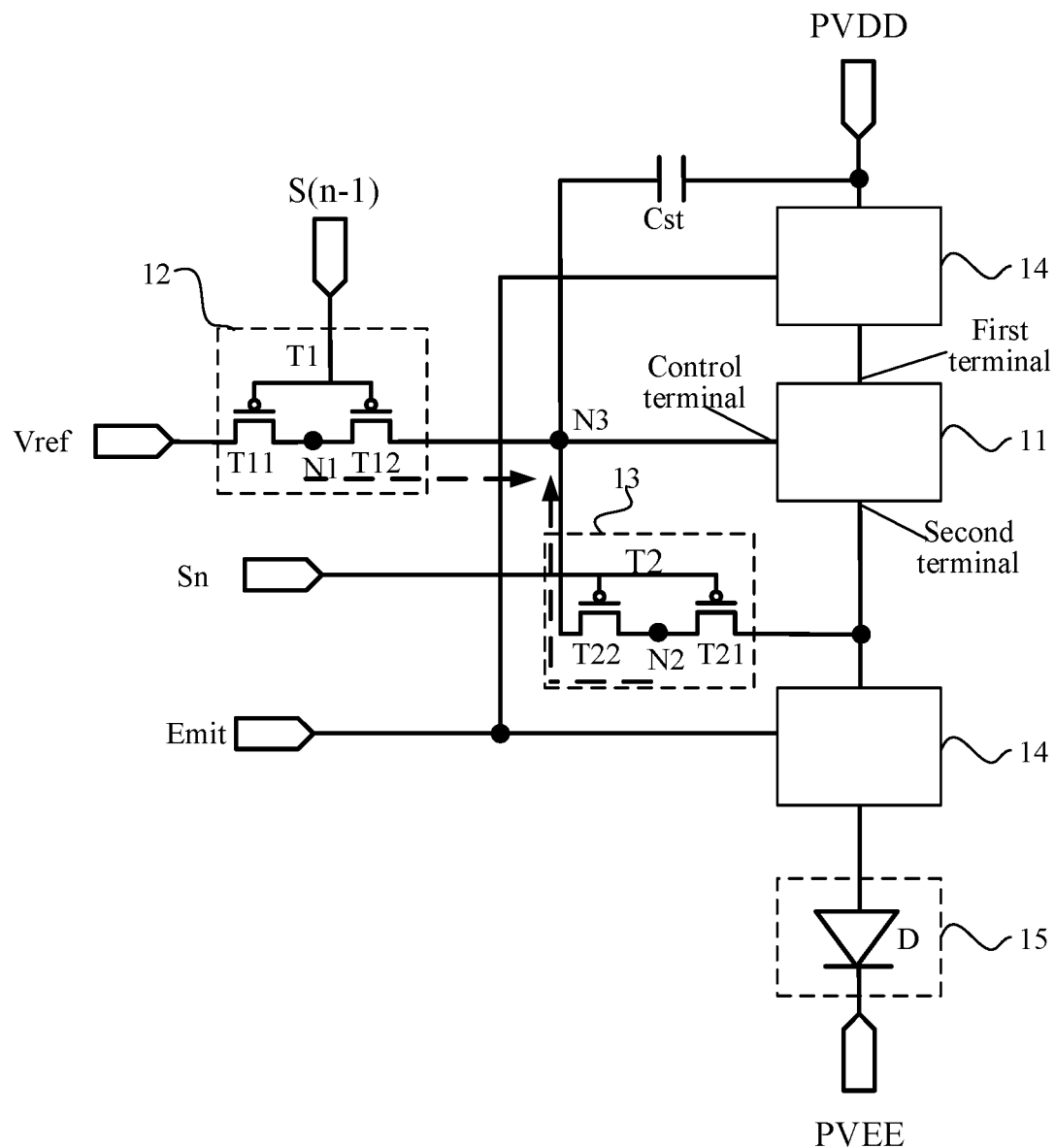
FIG. 6 illustrates a schematic circuit diagram of a pixel circuit.
Figure 7:
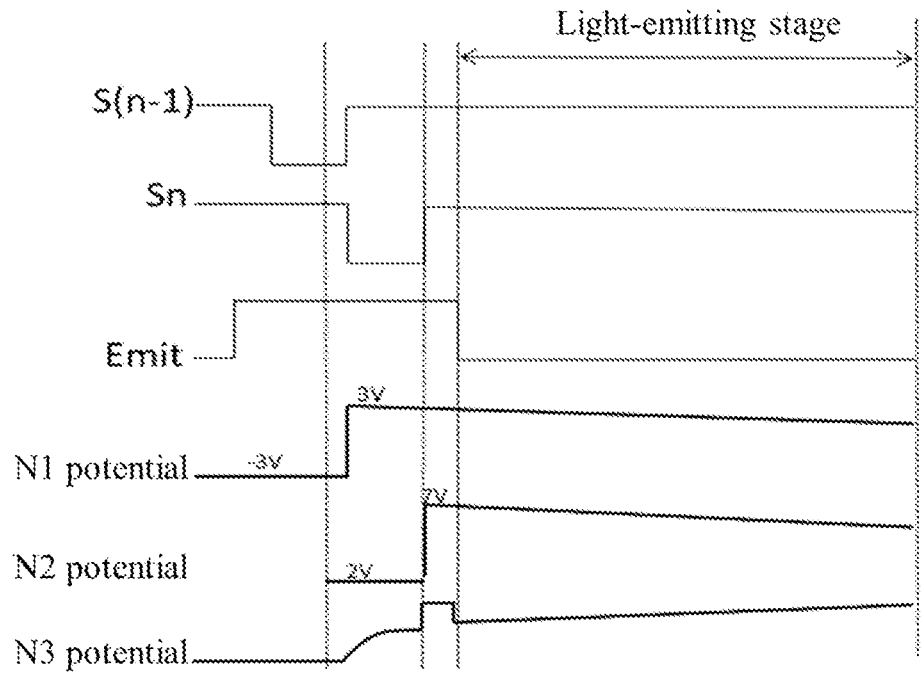
FIG. 7 illustrates a schematic diagram of a potential of a node of a pixel circuit in FIG. 6.

The difference between the embodiment associated with FIG. 6 and the embodiment associated with FIG. 4 may include that the pixel circuit 10 may not include the first capacitor and the second capacitor. Referring to FIG. 6 and FIG. 7, when the signal of the first scanning signal line S(n−1) is jumped from a low-level to a high-level, the gate potential of the first dual-gate transistor T1 may also be jumped from a low-level to a high-level, which may increase the potential of the first intermediate node N1, for example, from −3V to 3V. When the signal of the second scanning signal line Sn is jumped from a low-level to a high-level, the gate potential of the second dual-gate transistor T2 may also be jumped from a low-level to a high-level, which may increase the potential of the second intermediate node N2, for example, from 2V to 7V. In the light-emitting stage, there may be a leakage current from each of the first intermediate node N1 and the second intermediate node N2 to the control terminal of the driving module, which may increase the potential of the control terminal of the driving module and may cause a flicker phenomenon of the display panel.

Figure 8:
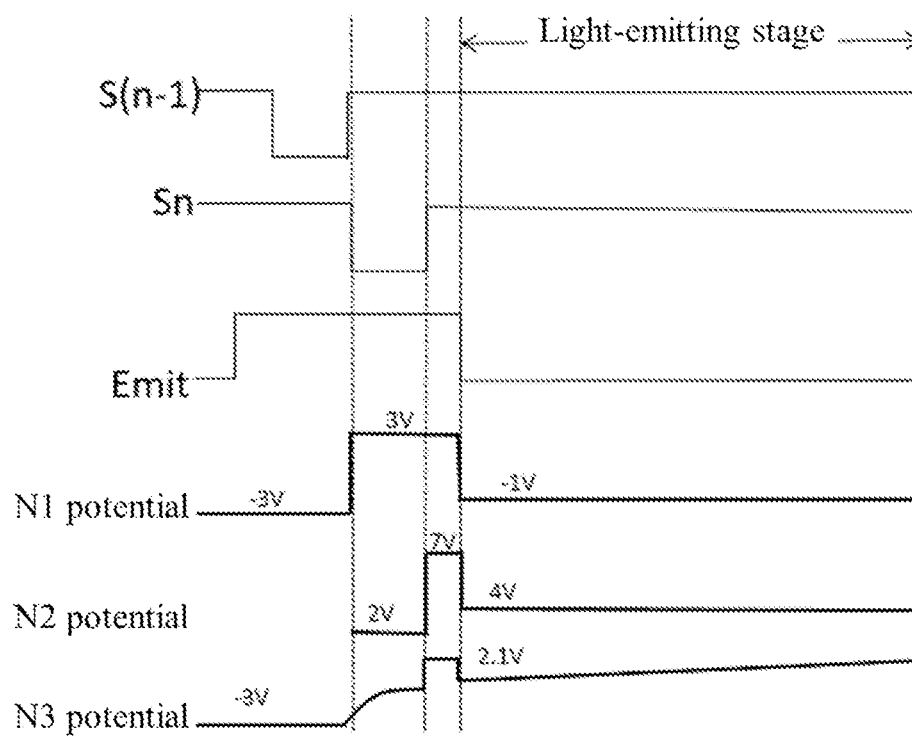
FIG. 8 illustrates a schematic diagram of a potential of a node of an exemplary pixel circuit consistent with disclosed embodiments of the present disclosure.

In the present disclosure, the first capacitor C1 and the second capacitor C2 may be provided. Referring to FIG. 4 and FIG. 8, when the signal of the first scanning signal line S(n−1) is jumped from a low-level to a high-level, the gate potential of the first dual-gate transistor T1 may also be jumped from a low-level to a high-level, which may increase the potential of the first intermediate node N1, for example, from −3V to 3V. When the signal of the light-emitting control signal line Emit is jumped from a low-level to a high-level, the potential of the first intermediate node N1 may be pulled down, for example, from 3V to −1V, which may be equivalent to reducing the amount of change in the potential of the first intermediate node N1.

Similarly, when the signal of the second scanning signal line Sn is jumped from a low-level to a high-level, the gate potential of the second dual-gate transistor T2 may also be jumped from a low-level to a high-level, which may increase the potential of the second intermediate node N2, for example, from 2V to 7V. When the signal of the light-emitting control signal line Emit is jumped from a low-level to a high-level, the potential of the second intermediate node N2 may be pulled down, for example, from 7V to 4V, which may be equivalent to reducing the amount of change in the potential of the second intermediate node N2.

In addition, the greater the capacitance of the first capacitor C1 and/or the second capacitor C2, the greater the amplitude of the change in the potential of the first intermediate node N1 and/or the second intermediate node N2. In the light-emitting stage, the potential of the first intermediate node N1 may be a negative potential. When the capacitance of the first capacitor C1 is greater than or equal to the capacitance of the first parasitic capacitor, the first intermediate node N1 may be jumped to a negative potential. In the light-emitting stage, the potential of the second intermediate node N2 may be a positive potential. When the capacitance of the second capacitor C2 is greater than or equal to the capacitance of the second parasitic capacitor, the second intermediate node N2 may be jumped to a positive potential. Therefore, the leakage current from each of the first intermediate node N1 and the second intermediate node N2 to the control terminal of the driving module may be reduced as much as possible, thereby stabilizing the potential of the control terminal of the driving module, and solving the flicker problem of the display panel.

In certain embodiments, referring to FIG. 4 and FIG. 5, the working process of the pixel circuit 10 may include a reset stage, a data-writing stage, and a light-emitting stage. The data-writing stage may be performed after the reset stage, and the light-emitting stage may be performed after the data-writing stage. In the reset stage, the signal provided by the first scanning signal line S(n−1) may control the first dual-gate transistor T1 to be turned on. In the data-writing stage, the signal provided by the second scanning signal line Sn may control the second dual-gate transistor T2 to be turned on. In the light-emitting stage, the signal provided by the light-emitting control signal line Emit may control the light-emitting control module 14 to be turned on.

In addition, each of a voltage jump direction of the signal provided by the first scanning signal line S(n−1) in a moment at which the first dual-gate transistor T1 is turned from on to off and a voltage jump direction of the signal provided by the second scanning signal line Sn in a moment at which the second dual-gate transistor T2 is turned from on to off may be opposite to a voltage jump direction of the signal provided by the light-emitting control signal line Emit in a moment at which the light-emitting control module 14 is turned from off to on.

For illustrative purposes, FIG. 5 may illustrate that each of the voltage jump direction of the signal provided by the first scanning signal line S(n−1) in a moment at which the first dual-gate transistor T1 is turned from on to off and the voltage jump direction of the signal provided by the second scanning signal line Sn in a moment at which the second dual-gate transistor T2 is turned from on to off may be from a low-level to a high-level, which may increase the potential of the first intermediate node N1 and the potential of the second intermediate node N2. The voltage jump direction of the signal provided by the light-emitting control signal line Emit in a moment at which the light-emitting control module 14 is turned from off to on may be from a high-level to a low-level, which may pull down the potential of the first intermediate node N1 and the potential of the second intermediate node N2 using the first capacitor C1 and the second capacitor C2.

In another embodiment, each of the voltage jump direction of the signal provided by the first scanning signal line S(n−1) in a moment at which the first dual-gate transistor T1 is turned from on to off and the voltage jump direction of the signal provided by the second scanning signal line Sn in a moment at which the second dual-gate transistor T2 is turned from on to off may be from a high-level to a low-level, and the voltage jump direction of the signal provided by the light-emitting control signal line Emit in a moment at which the light-emitting control module 14 is turned from off to on may be from a low-level to a high-level, which may not be limited by the present disclosure.

Through configuring the voltage jump direction of the signal provided by the first scanning signal line S(n−1) and the voltage jump direction of the signal provided by the second scanning signal line Sn to be opposite to the voltage jump direction of the signal provided by the light-emitting control signal line Emit, in a case where the potentials of the first intermediate node N1 and the second intermediate node N2 are pulled up or pulled down, the potentials of the first intermediate node N1 and the second intermediate node N2 may change in an opposite direction, such that the potentials of the first intermediate node N1 and the second intermediate node N2 may be remained unchanged as much as possible.

In certain embodiments, the first dual-gate transistor T1 may be turned from on to off before or while the light-emitting control module 14 is turned from off to on. The second dual-gate transistor T2 may be turned from on to off before or while the light-emitting control module 14 is turned from off to on. Therefore, the voltage change of the first intermediate node N1 caused by the first dual-gate transistor T1 being turned from on to off may cancel out the voltage change of the first intermediate node N1 caused by the light-emitting control module 14 being turned from off to on. The voltage change of the second intermediate node N2 caused by the second dual-gate transistor T2 being turned from on to off may cancel out the voltage change of the light-emitting control module 14 being turned from off to on.

In one embodiment, the high-level and the low-level of the scanning signals transmitted by the first scanning signal line and the second scanning signal line may be 8V and −7V, respectively. The high-level and the low-level of the light-emitting control signal transmitted by the light-emitting control signal line may be 8V and −7V, respectively.

Referring to FIG. 4, the first dual-gate transistor T1, the second dual-gate transistor T2 and the control terminal of the driving module 11 may be connected to the third node N3. In the light-emitting stage, a leakage current $I_{N3\text{-}N1}$ may flow from the third node N3 to the first intermediate node N1, and a leakage current $I_{N2\text{-}N3}$ may flow from the second intermediate node N2 to the third node N3. When the leakage current $I_{N3\text{-}N1}$ is equal to the leakage current $I_{N2\text{-}N3}$, the potential of the third node N3 may maintain dynamic balance.

In certain embodiments, the capacitance of one of the first capacitor C1 and the second capacitor C2 may be greater than the capacitance of the other one of the first capacitor C1 and the second capacitor C2. The leakage current $I_{N3\text{-}N1}$ may often be less than the leakage current $I_{N2\text{-}N3}$. Therefore, through configuring the capacitance of the first capacitor C1 to be greater than the capacitance of the second capacitor C2, the potential jump magnitude of the first intermediate node N1 may be substantially large, and the potential of the first intermediate node N1 may change to a substantially small negative potential, to increase the leakage current $I_{N3\text{-}N1}$. Therefore, the magnitude of the leakage current $I_{N3\text{-}N1}$ may be equal to the magnitude of the leakage current $I_{N2\text{-}N3}$, and the potential of the third node N3 may maintain dynamic balance.

When the leakage current $I_{N3\text{-}N1}$ is greater than the leakage current $I_{N2\text{-}N3}$, the capacitance of the first capacitor C1 may be smaller than the capacitance of the second capacitor C2.

In certain embodiments, the capacitance of the first capacitor C1 is c1, and the capacitance of the second capacitor C2 is c2. When c1−c2>2 fF, the potential of the control terminal of the driving module may be effectively stabilized. In one embodiment, the capacitance of the first capacitor C1 may be 6 fF, and the capacitance of the second capacitor C2 may be 4 fF.

In certain embodiments, the capacitance of the first capacitor C1, the capacitance of the second capacitor C2, the capacitance of the first parasitic capacitor, and the capacitance of the second parasitic capacitor may be in a range of approximately 1 fF-6 fF. The first capacitor C1 and the second capacitor C2 may be equivalent to the parasitic capacitor of the pixel circuit 10. In a case where the capacitance of the first capacitor C1, the capacitance of the second capacitor C2, the capacitance of the first parasitic capacitor, and the capacitance of the second parasitic capacitor are substantially large, charging of the control terminal of the driving module may be negatively affected. For example, the charging speed of the control terminal of the driving module may be substantially slow. Through configuring the capacitance of the first capacitor C1, the capacitance of the second capacitor C2, the capacitance of the first parasitic capacitor and the capacitance of the second parasitic capacitor to be in a range of approximately 1 fF-6 fF, the negative impact on the charging of the control terminal of the driving module such as the substantially slow charging speed of the control terminal of the driving module may be prevented.

Figure 9:
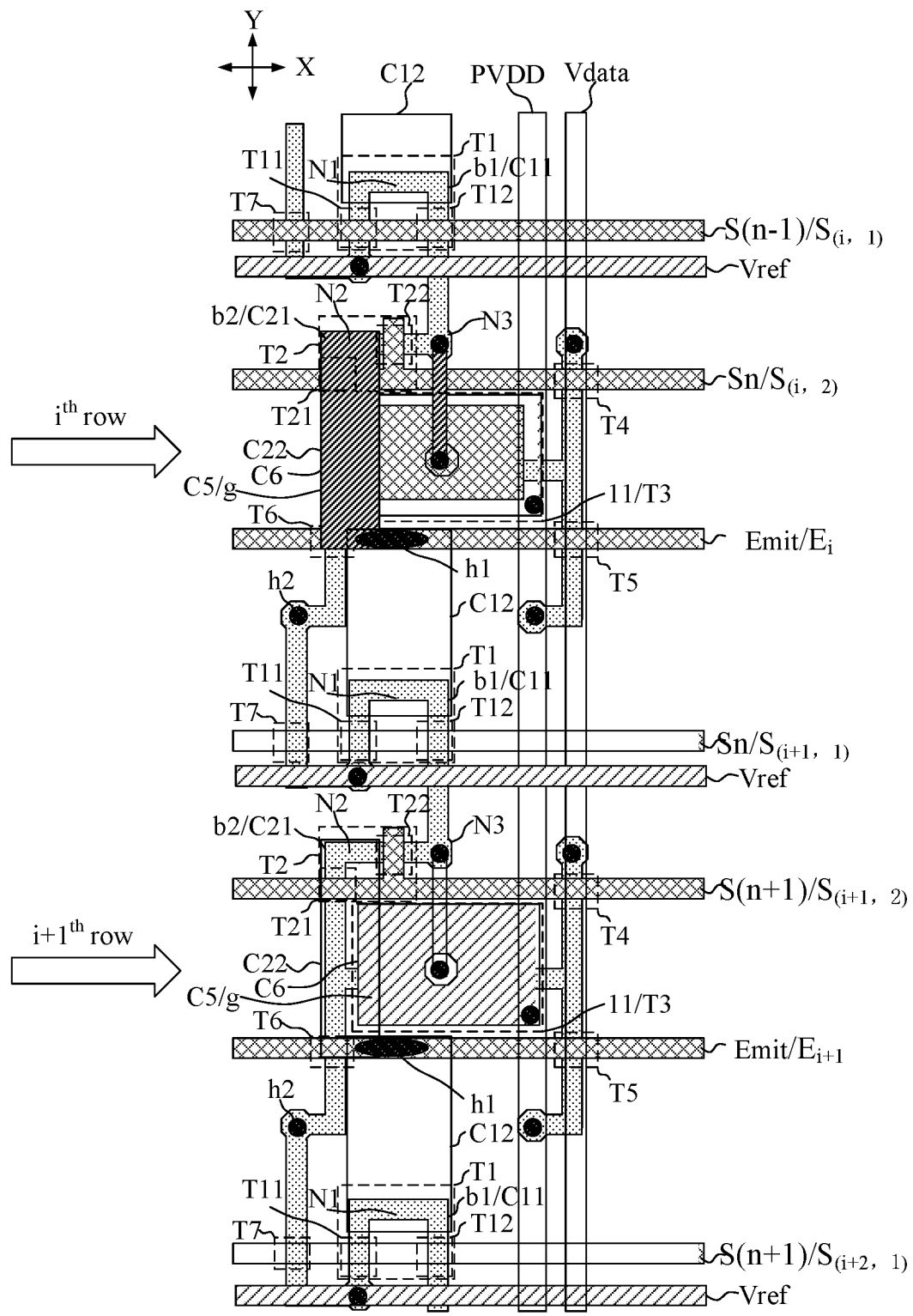
FIG. 9 illustrates a schematic top view of a local layout of an exemplary display panel consistent with disclosed embodiments of the present disclosure.

In certain embodiments, referring to FIG. 9, the first capacitor C1 may include a first plate C11 and a second plate C12. The second capacitor C2 may include a third plate C21 and a fourth plate C22. The first dual-gate transistor T1 may include a first connection portion b1, and the first connection portion b1 may include the first intermediate node N1. The second dual-gate transistor T2 may include a second connection portion b2, and the second connection portion b2 may include a second intermediate node N2. The first connection portion b1 may be connected between the second electrode of the first sub-transistor T11 and the first electrode of the second sub-transistor T12, and the second connection portion b2 may be connected between the second electrode of the third sub-transistor T21 and the first electrode of the fourth sub-transistor T22.

The first connection portion b1 may be multiplexed as the first plate C11 of the first capacitor C1, and the second connection portion b2 may be multiplexed as the third plate C21 of the second capacitor C2. In view of this, an additional plate connected to the first intermediate node N1 or the second intermediate node N2 as the first plate C11 of the first capacitor C1 or the third plate C21 of the second capacitor C2 may not need to be provided, which may simplify the process steps.

In certain embodiments, the second plate C12 of the first capacitor C1 and the fourth plate C22 of the second capacitor C2 may be disposed in a same layer and made of a same material. In view of this, the second plate C12 of the first capacitor C1 and the fourth plate C22 of the second capacitor C2 may be simultaneously formed in a same process step.

In certain embodiments, referring to FIG. 3 and FIG. 9, the first connection portion b1 and/or the second connection portion b2 may be made of a semiconductor material. The first connection portion b1, the second electrode of the first sub-transistor T11, and the first electrode of the second sub-transistor T12 may be disposed in the semiconductor layer b. The second connection portion b2, the second electrode of the third sub-transistor T21 and the first electrode of the fourth sub-transistor T22 may be disposed in the semiconductor layer b. In addition, the first electrode of the first sub-transistor T11 and the second electrode of the second sub-transistor T12 may be disposed in the semiconductor layer b, and the first electrode of the third sub-transistor T21 and the second electrode of the fourth sub-transistor T22 may be disposed in the semiconductor layer b. The active layer of the first dual-gate transistor T1 and the active layer of the second dual-gate transistor T2 may be disposed in the semiconductor layer b.

The gate of the first dual-gate transistor T1, the gate of the second dual-gate transistor T2, the first scanning signal line S(n−1), the second scanning signal line Sn and the light-emitting control signal line Emit may be disposed in the gate metal layer M1. The reference signal line Vref may be disposed in the capacitor metal layer MC.

The pixel circuit 10 may further include a storage capacitor Cst. The storage capacitor Cst may include a fifth plate C5 and a sixth plate C6. The storage capacitor Cst may be electrically connected to the first power line PVDD and the control terminal g of the driving module 11, respectively. The fifth plate C5 may be multiplexed as the control terminal g of the driving module 11, and the sixth plate C6 may be disposed in the capacitor metal layer MC. The second plate C12 of the first capacitor C1 and the fourth plate C22 of the second capacitor C2 may be disposed in the source-drain metal layer M2.

If the second plate C12 and the fourth plate C22 are disposed in the gate metal layer M1, the first connection portion b1 and the second plate C12 may form a transistor instead of the first capacitor C1, and the second connection portion b2 and the fourth plate C22 may form a transistor instead of the second capacitor C2. In addition, to effectively stabilize the potential of the control terminal g of the driving module 11, the storage capacitor Cst may often be substantially large. Because the sixth plate C6 is disposed in the capacitor metal layer MC, if the second plate C12 and the fourth plate C22 are also disposed in the capacitor metal layer MC, the area of the sixth plate C6 may need to be reduced. In the present disclosure, both the second plate C12 of the first capacitor C1 and the fourth plate C22 of the second capacitor C2 may be disposed in the source-drain metal layer M2, which may neither form a redundant transistor nor occupy the space of the sixth plate C6 of the storage capacitor Cst.

In certain embodiments, each of the second plate C12 of the first capacitor C1 and the fourth plate C22 of the second capacitor C2 may be electrically connected to the light-emitting control signal line Emit through a via. In one embodiment, in a case where the orthographic projection of the second plate C12 on the substrate 01 and the orthographic projection of the fourth plate C22 on the substrate 01 overlap each other, the second plate C12 and the fourth plate C22 may be simultaneously connected to the light-emitting control signal line Emit through merely one first via h1. In a case where the orthographic projection of the second plate C12 on the substrate 01 does not overlap the orthographic projection of the fourth plate C22 on the substrate 01, the second plate C12 and the fourth plate C22 may be connected to the light-emitting control signal line Emit through two vias, respectively.

In certain embodiments, referring to FIG. 9, a plurality of light-emitting control signal lines Emit may be extended along the first direction X and spaced apart in the second direction Y. The second plate C12 of the first capacitor C1 and the fourth plate C22 of the second capacitor C2 may be extended along the second direction Y, to achieve the electrical connection between each of the first capacitor C1 and the second capacitor C2 with the light-emitting control signal line Emit. It should be understood that the second plate C12 and the fourth plate C22 may also have a certain length in the first direction X.

In certain embodiments, the display panel 100 may include a plurality of light-emitting control signal lines Emit and a plurality of rows of pixel circuits 10. The plurality of light-emitting control signal lines Emit may correspond to the plurality of rows of the pixel circuits in a one-to-one correspondence. For illustrative purposes, FIG. 9 illustrates the $i^{th}$ row of pixel circuits and the $i+1^{th}$ row of pixel circuits. The $i^{th}$ row of pixel circuits may correspond to the light-emitting control signal line $E_i$, and the $i+1^{th}$ row of pixel circuits may correspond to the light-emitting control signal line $E_{i+1}$. The first capacitor C1 in the $i+1^{th}$ row of pixel circuits may be electrically connected to the light-emitting control signal line E corresponding to the $i^{th}$ row of pixel circuits, and the second capacitor C2 in the $i+1^{th}$ row of pixel circuits may be electrically connected to the light-emitting control signal line $E_{i+1}$ corresponding to the $i+1^{th}$ row of pixel circuits, where i may be a positive integer.

In one embodiment, the second plate C12 of the first capacitor C1 in the $i+1^{th}$ row of pixel circuits may be electrically connected to the light-emitting control signal line E1 corresponding to the $i^{th}$ row of pixel circuits, and the fourth plate C22 of the second capacitor C2 may be electrically connected to the light-emitting control signal line $E_{i+1}$ corresponding to the $i+1^{th}$ row of pixel circuits, such that an extension length of each of the second plate C12 and the fourth plate C22 may be reduced.

In one embodiment, the signals on two adjacent rows of light-emitting control signal lines E and $E_{i+1}$ may be the same. When the signals on the two adjacent rows of light-emitting control signal lines E and $E_{i+1}$ are the same, the voltages of the signals on the light-emitting control signal lines E and $E_{i+1}$ may jump at a same time.

In another embodiment, the signals on the two adjacent rows of light-emitting control signal lines E and $E_{i+1}$ may be different. In the case where the signals on the two adjacent rows of light-emitting control signal lines E and $E_{i+1}$ are different, the voltages of the signals on the light-emitting control signal lines E and $E_{i+1}$ may jump at a different time. For illustrative purposes, the transistor in the pixel circuit may be a P-type transistor as an example. A time length of the difference between the moment at which the voltage of the signal on the light-emitting control signal line E1 jumps from a high-level and the moment at which the voltage of the signal on the light-emitting control signal line $E_{i+1}$ jumps from a high-level may be a time length of the signal on the light-emitting control signal line $E_{i+1}$ being at a high level. The time length of the signal on the light-emitting control signal line $E_{i+1}$ being at a high level may be substantially short, such that the influence caused by the different signals on the two adjacent rows of light-emitting control signal lines E and $E_{i+1}$ may be ignored.

In one embodiment, the $i^{th}$ row of pixel circuits may correspond to the first scanning signal line $S_{(i,\ 1)}$ and the second scanning signal line $S_{(i+1,\ 2)}$, and the $i+1^{th}$ row of pixel circuits may correspond to the first scanning signal line $S_{(i+1,\ 1)}$ and the second scanning signal line $S_{(i+1,\ 2)}$. The signal on the second scanning signal line $S_{(i,\ 2)}$ corresponding to the $i^{th}$ row of pixel circuits may be the same as the signal on the first scanning signal line $S_{(i+1,\ 1)}$ corresponding to the $i+1^{th}$ row of pixel circuits.

Figure 10:
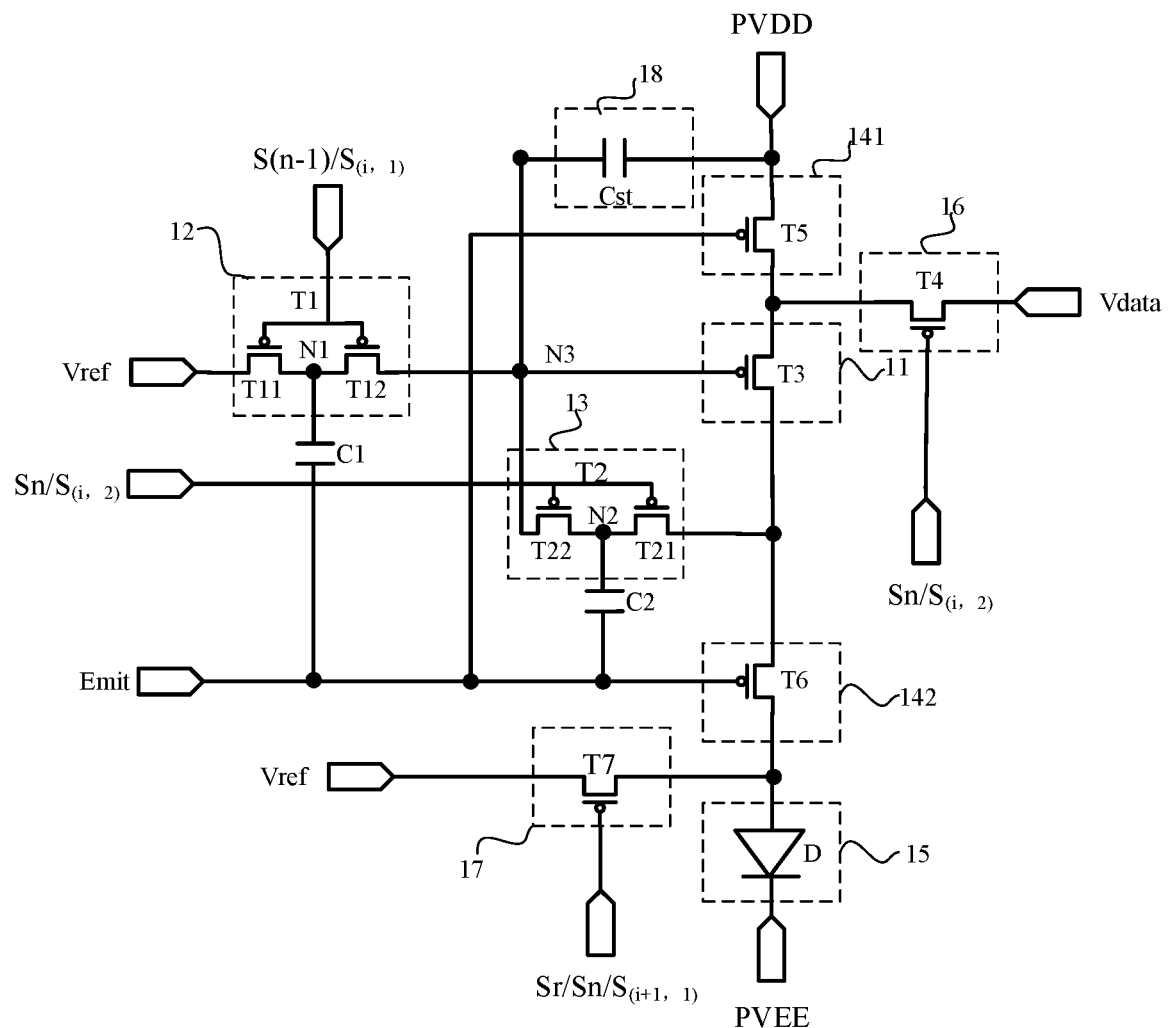
FIG. 10 illustrates a schematic circuit diagram of another exemplary pixel circuit consistent with disclosed embodiments of the present disclosure.
Figure 11:
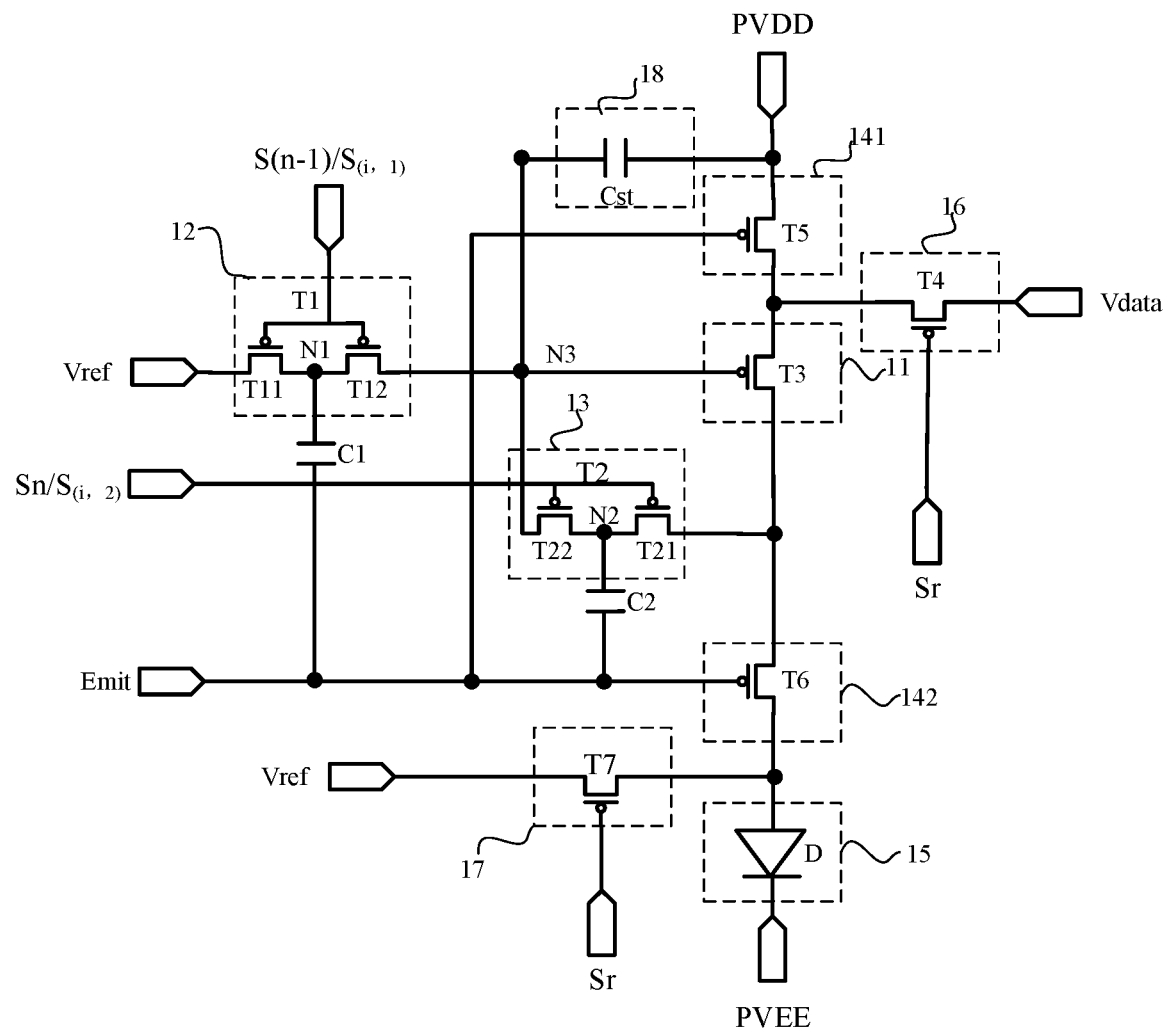
FIG. 11 illustrates a schematic circuit diagram of another exemplary pixel circuit consistent with disclosed embodiments of the present disclosure.

In certain embodiments, referring to FIG. 10 or FIG. 11, the pixel circuit 10 may further include a data-writing module 16, a second reset module 17, and a storage module 18. The light-emitting control module 14 may include a first light-emitting control module 141 and a second light-emitting control module 142.

The driving module 11 may include a driving transistor T3. The first light-emitting control module 141 may include a power-writing transistor T5, the data-writing module 16 may include a data-writing transistor T4, the second light-emitting control module 142 may include a light-emitting control transistor T6, and the second reset module 17 may include an anode reset transistor T7. The storage module 18 may include the storage capacitor Cst, and the light-emitting module 15 may include the light-emitting element D.

Each of the gate of the power-writing transistor T5 and the gate of the light-emitting control transistor T6 may be electrically connected to the light-emitting control signal line Emit. The first electrode of the power-writing transistor T5 may be electrically connected to the first power line PVDD, the second electrode of the power-writing transistor T5 may be electrically connected to the first electrode of the driving transistor T3, the first electrode of the light-emitting control transistor T6 may be electrically connected to the second electrode of the driving transistor T3, and the second electrode of the light-emitting control transistor T6 may be electrically connected to the anode of the light-emitting element D.

The first electrode of the data-writing transistor T4 may be electrically connected to the data signal line Vdata, and the second electrode of the data-writing transistor T4 may be electrically connected to the first electrode of the driving transistor T3.

The first electrode of the first dual-gate transistor T1 may be electrically connected to the reference signal line Vref, and the second electrode of the first dual-gate transistor T1 may be electrically connected to the gate of the driving transistor T3.

The first electrode of the second dual-gate transistor T2 may be electrically connected to the second electrode of the driving transistor T3, and the second electrode of the second dual-gate transistor T2 may be electrically connected to the gate of the driving transistor T3.

The gate of the anode reset transistor T7 may be electrically connected to a third scanning signal line Sr, the first electrode of the anode reset transistor T7 may be electrically connected to the reference signal line Vref, and the second electrode of the anode reset transistor T7 may be electrically connected to the anode of the light-emitting element D.

The first electrode of the storage capacitor Cst may be electrically connected to the first power line PVDD, and the second electrode of the storage capacitor Cst may be electrically connected to the gate of the driving transistor T3.

In certain embodiments, referring to FIG. 10, the first scanning signal line $S_{(i+1,\ 1)}$ corresponding to the $i+1^{th}$ row of pixel circuits may be multiplexed as the third scanning signal line Sr corresponding to the $i^{th}$ row of pixel circuits. The signal on the first scanning signal line $S_{(i+1,\ 1)}$ corresponding to the $i+1^{th}$ row of pixel circuits may be the same as the second scanning signal line $S_{(i,\ 2)}$ corresponding to the $i^{th}$ row of pixel circuits.

In certain embodiments, referring to FIG. 10, the gate of the data-writing transistor T4 may be electrically connected to the second scanning signal line Sn. In another embodiment, referring to FIG. 11, the gate of the data-writing transistor T4 may be electrically connected to the third scanning signal line Sr.

In a case where the first scanning signal line $S_{(i+1,\ 1)}$ corresponding to the $i+1^{th}$ row of pixel circuits is multiplexed as the third scanning signal line Sr corresponding to the $i^{th}$ row of pixel circuits, each row of pixel circuits may be provided with merely two scanning signal lines, which may reduce a quantity of the scanning signal lines and a quantity of shift register circuits S-VSR1, and may achieve a narrow frame.

For illustrative purposes, the first scanning signal line $S_{(i+1,\ 1)}$ may be multiplexed as the third scanning signal line Sr, the gate of the data-writing transistor T4 may be electrically connected to the second scanning signal line Sn, and each transistor of the pixel circuit may be a P-type transistor, and the $i^{th}$ row of pixel circuits may be used as an example for description. Referring to FIG. 5 and FIG. 10, in the reset stage, the first scanning signal line $S_{(i,1)}$ may provide a low level, and the first dual-gate transistor T1 may be turned on to reset the gate potential of the driving transistor T3. In the data-writing stage, the second scanning signal line $S_{(i,\ 2)}$ may provide a low-level signal, the data-writing transistor T4 and the second dual-gate transistor T2 may be turned on, and the data signal on the data signal line Vdata may be written to the gate of the driving transistor T3 to compensate the threshold voltage of the driving transistor T3. Further, the anode reset transistor T7 may be turned on to reset the anode potential of the light-emitting element. In the light-emitting stage, the light-emitting control signal line Emit may provide a low-level signal, the power-writing transistor T5 and the light-emitting control transistor T6 may be turned on, and the driving current generated by the driving transistor T3 may be transmitted to the light-emitting element to drive the light-emitting element to emit light.

The signal of the third scanning signal line Sr may be different from the signal of the first scanning signal line $S_{(i+1, 1)}$. In other words, the signal of the third scanning signal line Sr may be independently controlled.

For illustrative purposes, the signal of the third scanning signal line Sr may be different from the signal of the first scanning signal line $S_{(i+1, 1)}$ as an example. The gate of the data-writing transistor T4 may be electrically connected to the third scanning signal line Sr. The working process of the display panel may include a data-writing frame and a holding frame. The data signal line Vdata may provide a data signal and a regulated voltage. In the data-writing frame, the pixel circuit may perform the data-writing stage and the light-emitting stage. In the data-writing stage, the data-writing module 16 and the second dual-gate transistor T2 may be turned on, and the data-writing module may write the data signal. In the holding frame, the pixel circuit may perform a reset adjustment stage and the light-emitting stage. In the reset adjustment stage, the data-writing module 16 may be turned on, the second dual-gate transistor T2 may be turned off, and the data-writing module may write the adjustment voltage to adjust the bias state of the driving transistor.

Figure 12:
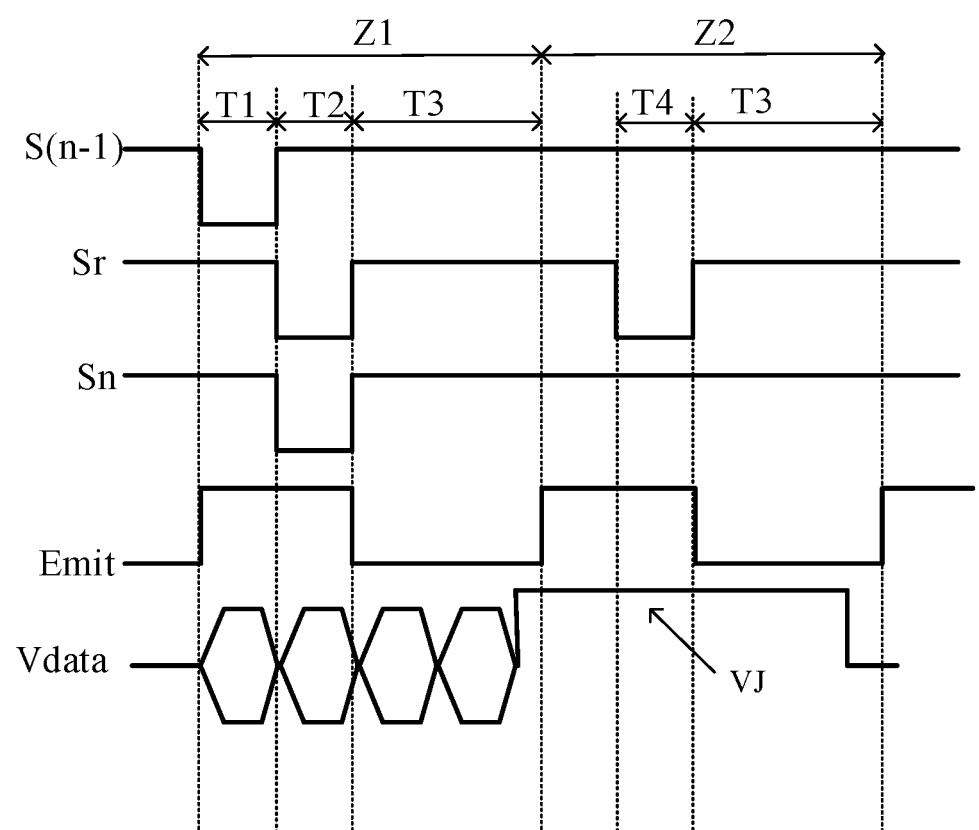
FIG. 12 illustrates an exemplary timing sequence diagram of a display panel in FIG. 11 consistent with disclosed embodiments of the present disclosure.

In one embodiment, for illustrative purposes, each transistor of the pixel circuit may be a P-type transistor as an example for description. Referring to FIG. 11 and FIG. 12, in a data-writing frame Z1, the pixel circuit may perform the reset stage S1, the data-writing stage S2 and the light-emitting stage S3. The reset stage S1 may be performed before the data-writing stage S2. In the reset stage S1, the first dual-gate transistor T1 may be turned on to reset the gate of the driving transistor T3. Therefore, when the display panel performs the data-writing frame Z1, an accurate data voltage may be written into the gate of the driving transistor. In the data-writing stage S2, the data-writing module 16 and the second dual-gate transistor T2 may be turned on to write a data signal into the gate of the driving transistor T3, and the second dual-gate transistor T2 may compensate the threshold voltage of the driving transistor T3.

In one embodiment, the data-writing module 16 may be turned on under the control of the signal of the third scanning signal line Sr, to write the signal provided by the data signal line Vdata into the source of the driving transistor T3. The second dual-gate transistor T2 may be turned on under the control of the signal of the second scanning signal line Sn, to provide the voltage of the drain of the driving transistor T3 to the gate of the driving transistor T3. In the light-emitting stage S3, the light-emitting control module 14 may be turned on under the control of the signal of the light-emitting control signal line Emit, to provide the driving current generated by the driving transistor T3 to the light-emitting element D.

In the holding frame Z2, the pixel circuit may perform the reset adjustment stage S4 and the light-emitting stage S3. In the reset adjustment stage S4, the data-writing module 16 may be turned on, the second dual-gate transistor T2 may be turned off, and an adjustment voltage VJ may be written into the data-writing module 16 to adjust the bias state of the driving transistor T3. In one embodiment, the data-writing module 16 may be turned on under the control of the signal of the third scanning signal line Sr, to write the adjustment voltage VJ provided by the data signal line Vdata to the source of the driving transistor T3 and to adjust the bias state of the driving transistor T3. The working process of the pixel circuit in the light-emitting stage S3 in the holding frame Z2 may be the same as the working process of the pixel circuit in the light-emitting stage S3 in the data-writing frame Z1.

At the beginning of the light-emitting stage, the brightness of the light-emitting element D may gradually increase, and the speed of rising brightness may be related to the bias state of the driving transistor T3.

The data-writing frame Z1 may include a stage of resetting the gate of the driving transistor T3. After the voltage signal VR of the reference signal line Vref is provided to the gate of the driving transistor T3, the bias state of the driving transistor T3 may be affected. At the beginning of the data-writing stage S2, the gate voltage of the driving transistor T3 may be VR. The source of the driving transistor T3 may maintain a voltage in the last light-emitting stage, which may be close to the voltage VP provided by the first power line PVDD. In view of this, the voltage of the gate of the driving transistor T3 with respect to the source of the driving transistor T3 may be Vgs1=VR−VP.

The working process of the display panel in the present disclosure may include the holding frame Z2, and the holding frame Z2 may include the reset adjustment stage S4. In the reset adjustment stage S4, the data-writing module 16 may write the adjustment voltage VJ to the source of the driving transistor T3. In such stage, the voltage of the source of the driving transistor T3 may be close to VJ, while the gate of the driving transistor T3 may maintain the potential in the last light-emitting stage. Therefore, the voltage of the gate of the driving transistor T3 may be close to VData+Vth, where VData may be a data voltage. In view of this, the voltage of the gate of the driving transistor T3 with respect to the source of the driving transistor T3 may be Vg2=VData+Vth−VJ.

In the present disclosure, by controlling the adjustment voltage VJ, the bias state of the driving transistor T3 may be adjusted to reduce the difference between Vgs2 and Vgs1, such that Vgs2 may be close to Vgs1. In other words, in the reset adjustment stage S4, the adjustment voltage VJ may be written to the source of the driving transistor T3, to simulate the bias state of the driving transistor T3 in the data-writing frame Z1. Therefore, the speed of rising brightness of the light-emitting element D in the holding frame Z2 may be reduced, such that the speed of rising brightness of the light-emitting element in the holding frame Z2 may tend to be consistent with the speed of rising brightness of the light-emitting element in the data-writing frame Z1, which may improve the flicker problem of the display image.

In certain embodiments, VP=4.6V and 6V≤VJ≤8V. Through configuring VJ to be greater than VP and VJ not to be too large, the power consumption may not be too large.

In certain embodiments, each of the driving transistor T3, the power-writing transistor T5, the data-writing transistor T4, the first dual-gate transistor T1, the second dual-gate transistor T2, the light-emitting control transistor T6, and the anode reset transistor T7 may be a P-type transistor. In a case where every transistor has a same type, the manufacturing difficulty of the display panel may be reduced.

In certain embodiments, an active layer of each of the driving transistor T3, the power-writing transistor T5, the data-writing transistor T4, the first dual-gate transistor T1, the second dual-gate transistor T2, the light-emitting control transistor T6, and the anode reset transistor T7 may be made of a material including polysilicon. For example, the active layer of each of the driving transistor T3, the power-writing transistor T5, the data-writing transistor T4, the first dual-gate transistor T1, the second dual-gate transistor T2, the light-emitting control transistor T6, and the anode reset transistor T7 may be made of a material including low temperature polysilicon (LTPS). The polysilicon transistor may have a substantially high mobility, which may improve the driving capability of the pixel circuit.

Figure 13:
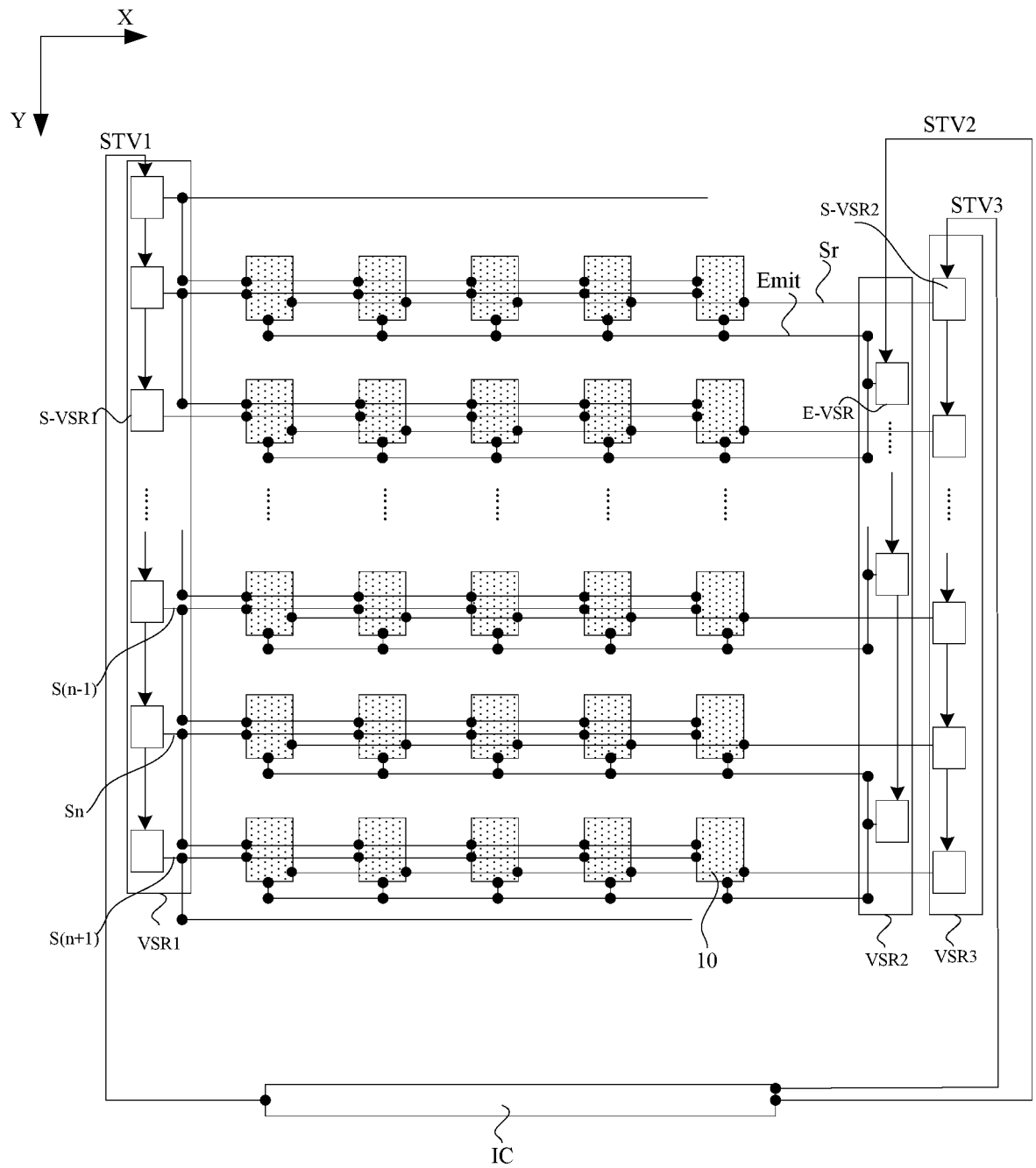
FIG. 13 illustrates a schematic top view of another exemplary display panel consistent with disclosed embodiments of the present disclosure.

In certain embodiments, referring to FIG. 13, the display panel 100 may include the first shift register VSR1, the second shift register VSR2, and a third shift register VSR3. The first shift register VSR1 and the second shift register VSR2 shown in FIG. 13 may be the same as the first shift register VSR1 and the second shift register VSR2 shown in FIG. 1, which may not be repeated herein.

The third shift register VSR3 may include a plurality of cascaded third shift register circuits S-VSR2, and each third shift register circuit S-VSR2 may provide a scanning signal to a single row of pixel circuits 10. In one embodiment, the third shift register circuit S-VSR2 may be electrically connected to the gate of the data-writing transistor T4 and the gate of the anode reset transistor T7 in the pixel circuit 10 through the third scanning signal line Sr. The driving chip IC may provide a third start signal STV3 for the third shift register VSR3.

In addition, a clock signal line (not shown in the Figure), a high-level signal line (VGH, not shown in the Figure), and a low-level signal line (VGL, not shown in the Figure) may be connected between the third shift register VSR3 and the driving chip IC. The driving chip IC may provide a clock signal, a high-level signal, and a low-level signal to the third shift register VSR3.

In one embodiment, referring to FIG. 13, the display panel 100 may include one first shift register VSR1, one second shift register VSR2, and one third shift register VSR3. The one first shift register VSR1, the one second shift register VSR2, and the one third shift register VSR3 may be disposed on opposite sides of the display panel 100 in the second direction Y. In another embodiment, the one first shift register VSR1, the one second shift register VSR2, and the one third shift register VSR3 may be disposed on a same side of the display panel 100.

In another embodiment, the display panel 100 may include two first shift registers VSR1, two second shift registers VSR2, and two third shift registers VSR3. Each end of each of the first scanning signal line and the second scanning signal line may be electrically connected to a first shift register VSR1 of the two first shift registers VSR1. Each end of the light-emitting control signal line Emit may be electrically connected to a second shift register VSR2 of the two second shift registers VSR2. Each end of the third scanning signal line may be electrically connected to a third shift register VSR3 of the two third shift registers VSR3.

In certain embodiments, for illustrative purposes, the first dual-gate transistor T1 may include the first sub-transistor T11 and the second sub-transistor T12, and the second dual-gate transistor T2 may include the third sub-transistor T21 and the fourth sub-transistor T22 as an example. The first intermediate node N1 may be a connection point between a second electrode of the first sub-transistor T11 and a first electrode of the second sub-transistor T12, and the second intermediate node N2 may be a connection point between a second electrode of the third sub-transistor T21 and a first electrode of the fourth sub-transistor T22. A first electrode of the first sub-transistor T11 may be electrically connected to the reference signal line Vref, and a second electrode of the second sub-transistor T12 may be electri-cally connected to the control terminal of the driving module 11. A first electrode of the third sub-transistor T21 may be electrically connected to a second terminal of the driving module 11, and a second electrode of the fourth sub-transistor T22 may be electrically connected to the control terminal of the driving module 11.

Figure 14:
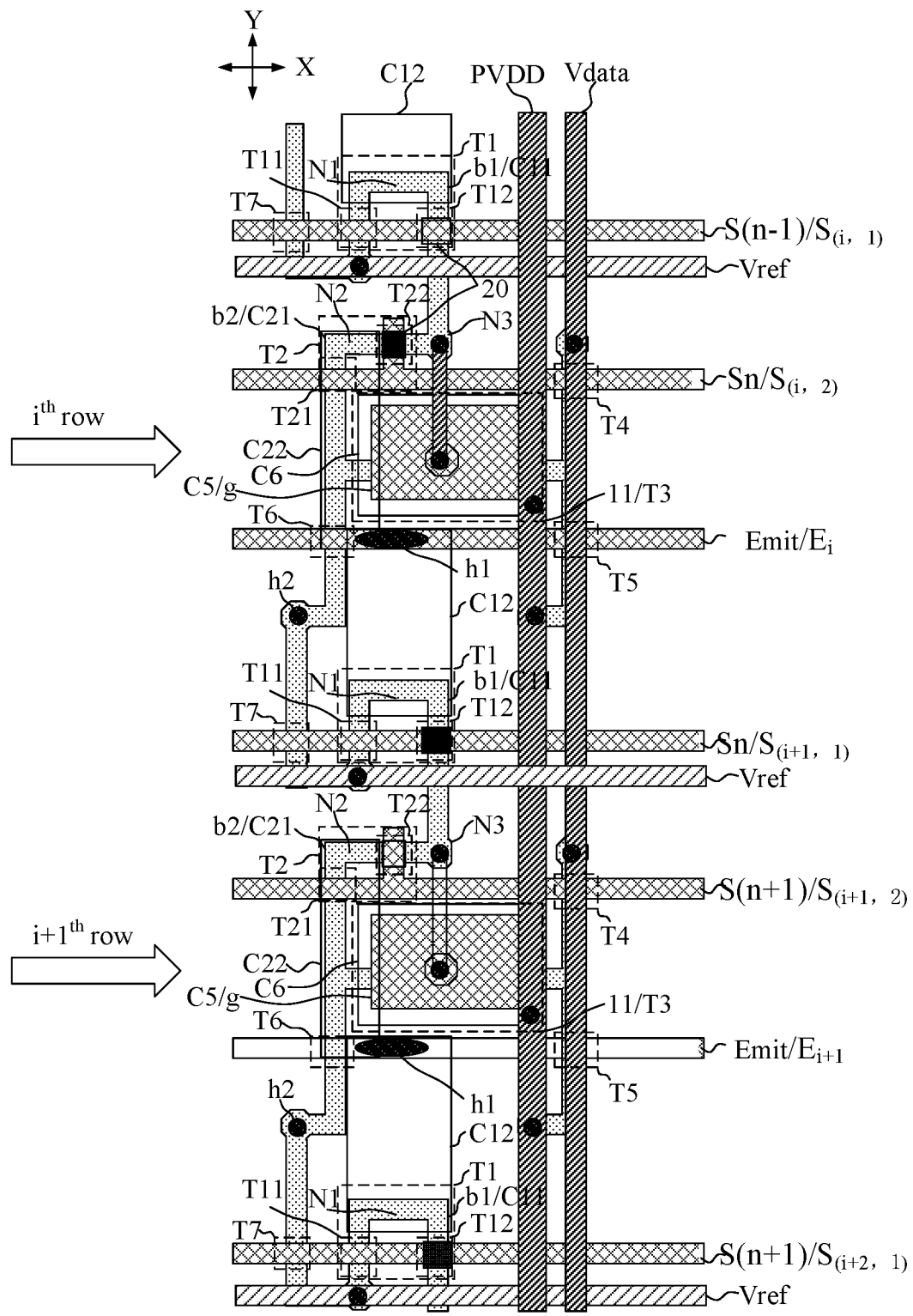
FIG. 14 illustrates a schematic top view of a local layout of another exemplary display panel consistent with disclosed embodiments of the present disclosure.

Referring to FIG. 14, the display panel 100 may further include a light-shielding layer 20. An orthographic projection of the channel of at least one of the second sub-transistor T12 and the fourth sub-transistor T22 on the plane of the display panel 100 may at least partially overlap an orthographic projection of the light-shielding layer 20 on the plane of the display panel 100.

It should be understood that the channel of the second sub-transistor T12 may be an overlapped region between the active layer of the second sub-transistor T12 and the gate thereof, and the channel of the fourth sub-transistor T22 may be an overlapped region between the active layer of the fourth sub-transistor T22 and the gate thereof.

FIG. 14 exemplarily illustrates that the orthographic projection of the channel of each of the second sub-transistor T12 and the fourth sub-transistor T22 on the plane of the display panel 100 may overlap the orthographic projection of the light-shielding layer 20 on the plane of the display panel 100.

Under light illumination, a leakage current of the transistor may increase. By shielding the sub-transistor close to the control terminal of the driving module 11 in the dual-gate transistor, the leakage current of the sub-transistor close to the control terminal of the driving module 11 may decrease, such that the potential change of the control terminal of the driving module 11 may be substantially small, which may improve the flicker problem of the display panel.

It should be understood that the orthographic projections of the channel of the first sub-transistor T11 and the channel of the third sub-transistor T21 on the plane of the display panel may not overlap the orthographic projection of the light-shielding layer 20 on the plane of the display panel 100. The channel of the second sub-transistor T12 may be shielded by the light-shielding layer 20, while the channel of the first sub-transistor T11 may not be shielded by the light-shielding layer 20. A ratio of leakage current between the first intermediate node N1 and the control terminal of the driving module 11 may decrease, while a ratio of the leakage current between the first intermediate node N1 and the reference signal line Vref may increase. The channel of the fourth sub-transistor T22 may be shielded by the light-shielding layer 20, while the channel of the third sub-transistor T21 may not be shielded by the light-shielding layer 20. A ratio of the leakage current between the second intermediate node N2 and the control terminal of the driving module 11 may decrease, while a ratio of the leakage current between the second intermediate node N2 and the second terminal of the driving module 11 may increase, such that the potential change of the control terminal of the driving module 11 may be substantially small.

In one embodiment, referring to FIG. 3, the light-shielding layer 20 may be disposed in a same layer as one of the source-drain metal layer and the anode RE. The light-shielding layer 20 may be made of a metal material capable of shielding light.

In one embodiment, referring to FIG. 9, each of the second electrode of the light-emitting control transistor T6 and the second electrode of the anode reset transistor T7 may be electrically connected to the anode of the light-emitting element through the second via h2.

Figure 15:
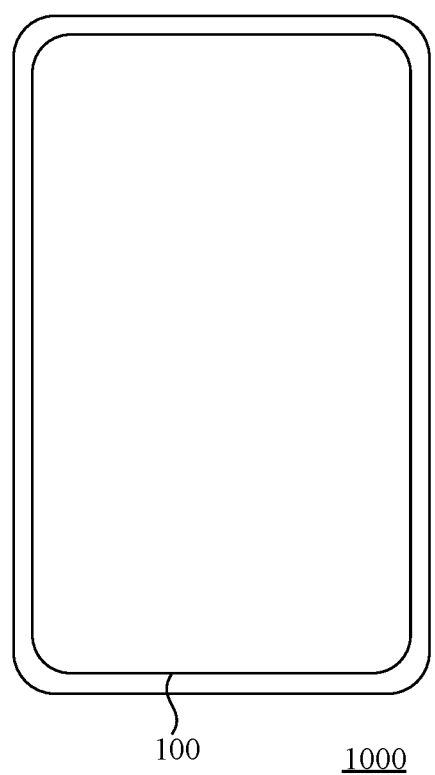
FIG. 15 illustrates a schematic diagram of an exemplary display device consistent with disclosed embodiments of the present disclosure.

The present disclosure also provides a display device. The display device may include the display panel provided in any one of the above-disclosed embodiments. FIG. 15 illustrates a schematic diagram of a display device. Referring to FIG. 15, the display device 1000 may include the display panel 100 provided in any one of the above-disclosed embodiments. For illustrative purposes, FIG. 15 merely illustrates a mobile phone as an example for the description of the display device 1000. It should be understood that the display device may be a wearable product, a computer, a television, a vehicle display device, or any other display device with a display function, which may not be limited by the present disclosure. The display device may have the beneficial effects of the display panel provided in the disclosed embodiments of the present disclosure, which may refer to the description of the display panel in the above-disclosed embodiments, and may not be repeated herein.

Accordingly, the present disclosure provides a display panel and a display device. By providing the first capacitor and the second capacitor, when the signal of the first scanning signal line is jumped from a low-level to a high-level, the gate potential of the first dual-gate transistor may also be jumped from a low-level to a high-level, which may increase the potential of the first intermediate node. When the signal of the light-emitting control signal line is jumped from a low-level to a high-level, the potential of the first intermediate node may be pulled down, which may be equivalent to reducing the amount of change in the potential of the first intermediate node.

Similarly, when the signal of the second scanning signal line is jumped from a low-level to a high-level, the gate potential of the second dual-gate transistor may also be jumped from a low-level to a high-level, which may increase the potential of the second intermediate node. When the signal of the light-emitting control signal line is jumped from a low-level to a high-level, the potential of the second intermediate node may be pulled down, which may be equivalent to reducing the amount of change in the potential of the second intermediate node.

In addition, the greater the capacitance of the first capacitor and/or the second capacitor, the greater the amplitude of the change in the potential of the first intermediate node and/or the second intermediate node. In the light-emitting stage, the potential of the first intermediate node may be a negative potential. When the capacitance of the first capacitor is greater than or equal to the capacitance of the first parasitic capacitor, the first intermediate node may be jumped to a negative potential. In the light-emitting stage, the potential of the second intermediate node may be a positive potential. When the capacitance of the second capacitor is greater than or equal to the capacitance of the second parasitic capacitor, the second intermediate node may be jumped to a positive potential. Therefore, the leakage current from each of the first intermediate node and the second intermediate node to the control terminal of the driving module may be reduced as much as possible, thereby stabilizing the potential of the control terminal of the driving module, and solving the flicker problem of the display panel.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A display panel, comprising:
a pixel circuit, including a driving module, a first reset module, a compensation module, a light-emitting control module and a light-emitting module, wherein:
the driving module, the light-emitting control module and the light-emitting module are connected in series between a first power line and a second power line, the driving module is configured to drive the light-emitting module to emit light, the light-emitting control module is configured to control the light-emitting module to enter a light-emitting stage, and a control terminal of the light-emitting control module is electrically connected to a light-emitting control signal line,
the first reset module is connected in series between a reference signal line and a control terminal of the driving module, the first reset module includes a first dual-gate transistor, a gate of the first dual-gate transistor is electrically connected to a first scanning signal line, and a first intermediate node of the first dual-gate transistor is electrically connected to the light-emitting control signal line through a first capacitor, and
the compensation module is connected in series between the control terminal of the driving module and a second terminal of the driving module, the compensation module includes a second dual-gate transistor, a gate of the second dual-gate transistor is electrically connected to a second scanning signal line, and a second intermediate node of the second dual-gate transistor is electrically connected to the light-emitting control signal line through a second capacitor, wherein:
the first dual-gate transistor includes a first parasitic capacitor, and the second dual-gate transistor includes a second parasitic capacitor,
a capacitance of the first capacitor is greater than or equal to a capacitance of the first parasitic capacitor, and/or
a capacitance of the second capacitor is greater than or equal to a capacitance of the second parasitic capacitor.

2. The display panel according to claim 1, wherein:
the capacitance of one of the first capacitor and the second capacitor is greater than the capacitance of another one of the first capacitor and the second capacitor.

3. The display panel according to claim 2, wherein:
the capacitance of the first capacitor is greater than the capacitance of the second capacitor.

4. The display panel according to claim 3, wherein:
the capacitance of the first capacitor is c1, and the capacitance of the second capacitor is c2, wherein c1-c2≥2 fF.

5. The display panel according to claim 1, wherein:
each of the capacitance of the first capacitor, the capacitance of the second capacitor, the capacitance of the first parasitic capacitor, and the capacitance of the second parasitic capacitor is in a range of approximately 1 fF-6 fF.

6. The display panel according to claim 1, wherein:
the first capacitor includes a first plate and a second plate, the first dual-gate transistor includes a first connection portion, and the first connection portion includes the first intermediate node, wherein the first connection portion is multiplexed as the first plate of the first capacitor; and the second capacitor includes a third plate and a fourth plate, the second dual-gate transistor includes a second connection portion, and the second connection portion includes the second intermediate node, wherein the second connection portion is multiplexed as the third plate of the second capacitor.

7. The display panel according to claim 6, wherein:
the second plate of the first capacitor and the fourth plate of the second capacitor are disposed in a same layer and made of a same material.

8. The display panel according to claim 6, further including:
a substrate;
a semiconductor layer, disposed on a side of the substrate, wherein the first connection portion and the second connection portion are disposed in the semiconductor layer;
a gate metal layer, disposed on a side of the semiconductor layer away from the substrate, wherein the gate of the first dual-gate transistor, the gate of the second dual-gate transistor, the first scanning signal line, the second scanning signal line and the light-emitting control signal line are disposed in the gate metal layer;
a capacitor metal layer, disposed on a side of the gate metal layer away from the substrate, wherein the reference signal line is disposed in the capacitor metal layer;
a source-drain metal layer, disposed on a side of the capacitor metal layer away from the substrate, wherein the second plate of the first capacitor and the fourth plate of the second capacitor are disposed in the source-drain metal layer; and
a storage capacitor, wherein the storage capacitor includes a fifth plate and a sixth plate, the two plates of the storage capacitor are electrically connected to the first power line and the control terminal of the driving module, respectively, the fifth plate is multiplexed as the control terminal of the driving module, and the sixth plate is disposed in the capacitor metal layer.

9. The display panel according to claim 8, wherein:
each of the second plate of the first capacitor and the fourth plate of the second capacitor is electrically connected to the light-emitting control signal line through a via.

10. The display panel according to claim 8, wherein:
a plurality of light-emitting control signal lines are extended along a first direction and distributed spaced apart in a second direction, and
both the second plate of the first capacitor and the fourth plate of the second capacitor are extended along the second direction.

11. The display panel according to claim 1, wherein:
the pixel circuit further includes a data-writing module, a second reset module, and a storage module, and the light-emitting control module includes a first light-emitting control module and a second light-emitting control module; and
the driving module includes a driving transistor, the first light-emitting control module includes a power-writing transistor, the data-writing module includes a data-writing transistor, the second light-emitting control module includes a light-emitting control transistor, the second reset module includes an anode reset transistor, the storage module includes a storage capacitor, and the light-emitting module includes the light-emitting element, wherein:

each of a gate of the power-writing transistor and a gate of the light-emitting control transistor is electrically connected to the light-emitting control signal line, a first electrode of the power-writing transistor is electrically connected to the first power line, a second electrode of the power-writing transistor is electrically connected to a first electrode of the driving transistor, a first electrode of the light-emitting control transistor is electrically connected to a second electrode of the driving transistor, and a second electrode of the light-emitting control transistor is electrically connected to an anode of the light-emitting element,
a first electrode of the data-writing transistor is electrically connected to a data signal line, and a second electrode of the data-writing transistor is electrically connected to the first electrode of the driving transistor,
a first electrode of the first dual-gate transistor is electrically connected to the reference signal line, and a second electrode of the first dual-gate transistor is electrically connected to a gate of the driving transistor,
a first electrode of the second dual-gate transistor is electrically connected to the second electrode of the driving transistor, and a second electrode of the second dual-gate transistor is electrically connected to the gate of the driving transistor,
a gate of the anode reset transistor is electrically connected to a third scanning signal line, a first electrode of the anode reset transistor is electrically connected to the reference signal line, and a second electrode of the anode reset transistor is electrically connected to the anode of the light-emitting element, and
a first electrode of the storage capacitor is electrically connected to the first power line, and a second electrode of the storage capacitor is electrically connected to the gate of the driving transistor.

12. The display panel according to claim 11, wherein:
a first scanning signal line corresponding to $i+1^{th}$ row of pixel circuits is multiplexed as a third scanning signal line corresponding to $i^{th}$ row of pixel circuits, wherein i is a positive integer.

13. The display panel according to claim 11, wherein:
a gate of the data-writing transistor is electrically connected to the second scanning signal line, or
the gate of the data-writing transistor is electrically connected to the third scanning signal line.

14. The display panel according to claim 1, wherein:
the pixel circuit further includes a data-writing module, and a second reset module;
the driving module includes a driving transistor;
the light-emitting control module includes a first light-emitting control module and a second light-emitting control module, wherein the first light-emitting control module includes a power-writing transistor, and the second light-emitting control module includes a light-emitting control transistor;
the data-writing module includes a data-writing transistor; and
the second reset module includes an anode reset transistor, wherein:
each of the driving transistor, the power-writing transistor, the data-writing transistor, the first dual-gate transistor, the second dual-gate transistor, the light-emitting control transistor, and the anode reset transistor is a P-type transistor.

15. The display panel according to claim 1, wherein:
a working process of the pixel circuit includes a reset stage, a data-writing stage, and a light-emitting stage, wherein:
in the reset stage, a signal provided by the first scanning signal line controls the first dual-gate transistor to be turned on,
in the data-writing stage, a signal provided by the second scanning signal line controls the second dual-gate transistor to be turned on, and
in the light-emitting stage, a signal provided by the light-emitting control signal line controls the light-emitting control module to be turned on, wherein:
each of a voltage jump direction of the signal provided by the first scanning signal line in a moment at which the first dual-gate transistor is turned from on to off and a voltage jump direction of the signal provided by the second scanning signal line in a moment at which the second dual-gate transistor is turned from on to off is opposite to a voltage jump direction of the signal provided by the light-emitting control signal line in a moment at which the light-emitting control module is turned from off to on.

16. The display panel according to claim 15, wherein:
the first dual-gate transistor is turned from on to off before or while the light-emitting control module is turned from off to on; and
the second dual-gate transistor is turned from on to off before or while the light-emitting control module is turned from off to on.

17. The display panel according to claim 1, further including:
a plurality of light-emitting control signal lines and a plurality of rows of pixel circuits, wherein the plurality of light-emitting control signal lines correspond to the plurality of rows of the pixel circuits in a one-to-one correspondence, and
the first capacitor in $i+1^{th}$ row of pixel circuits is electrically connected to the light-emitting control signal line corresponding to $i^{th}$ row of pixel circuits, and the second capacitor in the $i+1^{th}$ row of pixel circuits is electrically connected to the light-emitting control signal line corresponding to the $i+1^{th}$ row of pixel circuits, wherein i is a positive integer.

18. The display panel according to claim 1, further including:
a first shift register and a second shift register, wherein:
the first shift register includes a plurality of cascaded first shift register circuits, and each first shift register circuit provides a scanning signal to adjacent two rows of pixel circuits, and
the second shift register includes a plurality of cascaded second shift register circuits, and each second shift register circuit provides a light-emitting control signal to adjacent two rows of pixel circuits.

19. The display panel according to claim 1, further including:
a first shift register, a second shift register, and a third shift register, wherein:
the first shift register includes a plurality of cascaded first shift register circuits, and each first shift register circuit provides a scanning signal to adjacent two rows of pixel circuits,
the second shift register includes a plurality of cascaded second shift register circuits, and each second shift register circuit provides a light-emitting control signal to adjacent two rows of pixel circuits, and
the third shift register includes a plurality of cascaded third shift register circuits, and each third shift register circuit provides a scanning signal to a single row of pixel circuits.

20. A display device, comprising:
a display panel, the display panel including:
a pixel circuit, including a driving module, a first reset module, a compensation module, a light-emitting control module and a light-emitting module, wherein:
the driving module, the light-emitting control module and the light-emitting module are connected in series between a first power line and a second power line, the driving module is configured to drive the light-emitting module to emit light, the light-emitting control module is configured to control the light-emitting module to enter a light-emitting stage, and a control terminal of the light-emitting control module is electrically connected to a light-emitting control signal line,
the first reset module is connected in series between a reference signal line and a control terminal of the driving module, the first reset module includes a first dual-gate transistor, a gate of the first dual-gate transistor is electrically connected to a first scanning signal line, and a first intermediate node of the first dual-gate transistor is electrically connected to the light-emitting control signal line through a first capacitor, and
the compensation module is connected in series between the control terminal of the driving module and a second terminal of the driving module, the compensation module includes a second dual-gate transistor, a gate of the second dual-gate transistor is electrically connected to a second scanning signal line, and a second intermediate node of the second dual-gate transistor is electrically connected to the light-emitting control signal line through a second capacitor, wherein:
the first dual-gate transistor includes a first parasitic capacitor, and the second dual-gate transistor includes a second parasitic capacitor,
a capacitance of the first capacitor is greater than or equal to a capacitance of the first parasitic capacitor, and/or
a capacitance of the second capacitor is greater than or equal to a capacitance of the second parasitic capacitor.

* * * * *